United States Patent [19]
Morita et al.

[11] Patent Number: 5,606,172
[45] Date of Patent: Feb. 25, 1997

[54] EXPOSING APPARATUS AND EXPOSING METHOD OF WORKS

[75] Inventors: Akira Morita; Takehiko Okamura; Minoru Watanuki, all of Choufu, Japan

[73] Assignee: ORC Manufacturing Co., Ltd., Tokyo, Japan

[21] Appl. No.: 379,704

[22] Filed: Jan. 27, 1995

[51] Int. Cl.$^6$ .............................. G03F 7/20; G03F 9/00
[52] U.S. Cl. ...................... 250/492.2; 250/492.1; 250/453.11; 355/85; 355/89
[58] Field of Search ..................... 250/492.2, 492.1, 250/453.11; 355/85, 89

[56] References Cited

U.S. PATENT DOCUMENTS

| 4,555,630 | 11/1985 | Sheets et al. | 250/492.1 |
| 4,571,073 | 2/1986 | Diedrich et al. | 355/89 |

FOREIGN PATENT DOCUMENTS

| 0179508 | 4/1986 | European Pat. Off. . |
| 0516317 | 12/1992 | European Pat. Off. . |
| 4-35087 | 2/1992 | Japan . |
| 4-46445 | 4/1992 | Japan . |

OTHER PUBLICATIONS

IBM Technical Disclosure Bulletin, vol. 30, No. 12, May 1988, pp. 209–210 "Remote Location Optical Registration System", anonymous.

*Primary Examiner*—Jack I. Berman
*Attorney, Agent, or Firm*—Longacre & White

[57] ABSTRACT

An exposing apparatus provided with a first alignment stage B, a first exposing stage C, a reverse stage D, a second alignmen stage E and a second exposing stage F in which the first alignment stage B, the reverse stage D and the second alignment stage E being provided in a straight line and each of the first alignment stage B and the second alignment stage E being provided in perpendicular dirction to the straight line the first exposing stage C and the second exposing stage F, respectively, and the ultraviolet rays irradiation stage H being located between the first exposing stage C and the second exposing stage F, offers an improved exposing apparatus of smaller installation space, the upper printing frame being replaced very easily when deteriorated after long time use, the lower printing frame properly absorb and displace the work from the lower printing frame, smaller consumption of the electricity, and forming of the vacuum frame and locating of the work are performed efficiently and accurately.

14 Claims, 23 Drawing Sheets

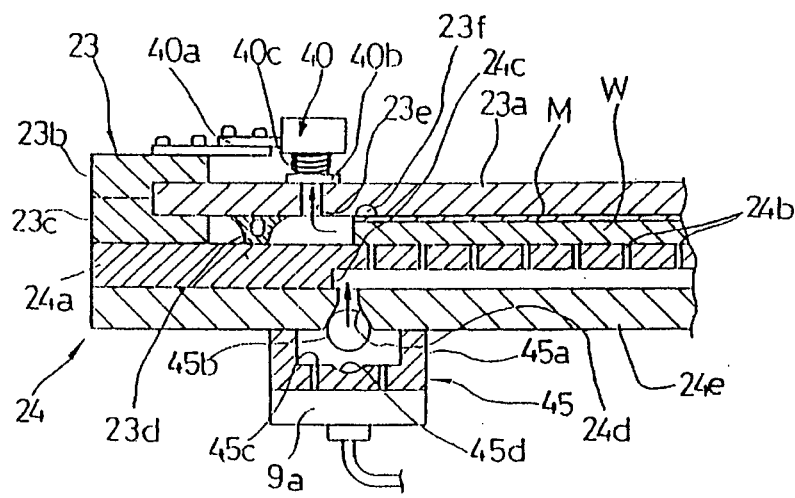
F I G. 9
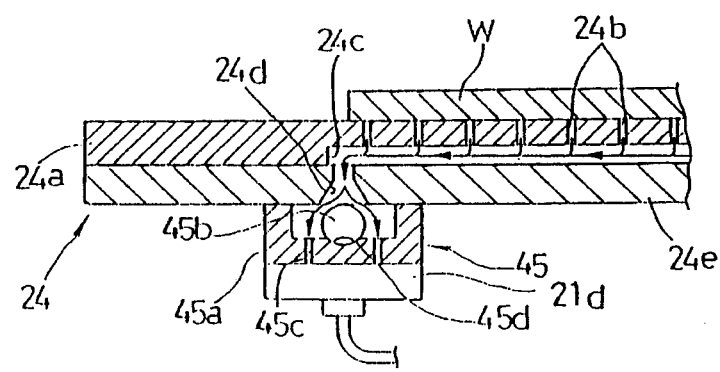
F I G. 10
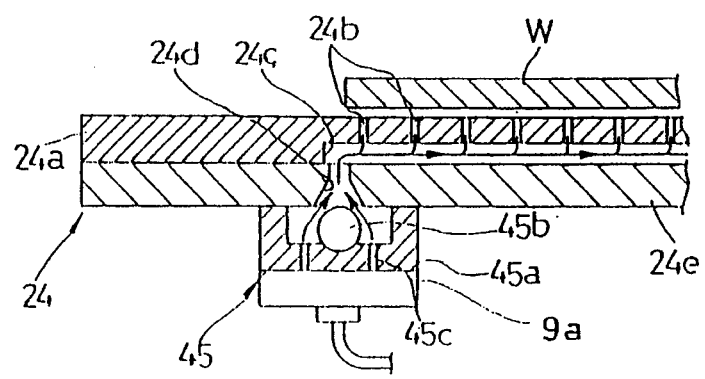
F I G. 11

EXPOSING APPARATUS AND EXPOSING METHOD OF WORKS

FIELD OF THE INVENTION

The present invention relates to an exposing apparatus and a method of exposing a work such as printed circuit board by irradiation of ultraviolet rays.

BACKGROUND OF THE INVENTION

Description of Prior Art

There have been offered various kinds of exposing apparatuses to expose a work with a predetermined pattern by ultraviolet rays. These conventional exposing appratuses expose a work by irradiation of ultraviolet rays after confirming a proper locational relation of a work and a mask film with each other by a camera when the work is held by printing frames. A CCD (charge coupled device) type image receiver is utilized for the camera.

An alignment working of the work and the mask film is carried out in an exposing section and this alignment working is called an inside locating system. In such a locating system alignment and exposing working are carried out in a straight line and thus productivity of exposed works is not as improved as expected.

In order to overcome the aforementioned defects the applicant already filed a Japanese laid-open Patent application with publication number of 4-350857. The application of 4-350857 comprises alignment and exposing workings in which the alignment and exposing workings are carried out outside an exposing section. This system is called an outside locating system. In the application of 4-350857 the outside locating system is utilized its advantages and high alignment accuracy of the work and mask film is performed.

As shown in FIG. 26, an exposing apparatus 100 comprises a feed-in stage 101, an alignment stage 102, an upstream unit 105 comprising an exposing stage 103 and a discharge stage 104, a reverse stage 106 of a work W located rearward of the discharge stage 104 of the upstream unit 105 and a downstream unit 111 being located rearward of the reverse stage 106 and comprising a feed-in stage 107, an alignment stage 108, all exposing stage 109 and a discharge stage 110.

A traverser 112 of the upstream unit 105 to transfer works to each stage is provided with a printing frame 113 located in the center thereof and handlers 114 and 115 located at both sides of the printing frame 113. On the other hand, a discharge device 120 of the downstream unit 111 is provided with a printing frame 121 located in the center thereof and handlers 122 and 123 located at both sides of the printing frame 121.

There are provided with delivery tables 117 and 125 movable holding another printing frames 116 and 124 between the alignment stages 102 and 108 and the exposing stages 103 and 109, respectively.

The reverse stage 106 is provided with a reverse unit (not shown) to reverse the work W from upper surface to under surface. The work W reversed at the reverse stage is supplied to the feed-in stage 107 of the downstream 111 by means of a handler (not shown).

Further, as shown in FIG. 28, the upper printing frame 113 (121) is provided with a vacuum suction mechanism 130 to suck the work with the lower printing frame 116 (124). The vacuum suction mechanism 130 comprises suction supporting sections 133a–133d mounted in the four corners of a transparent plate 131, a sealing rubber 134 of frame like pattern fitted to the work contacting to the transparent plate 131 and suction hoses 135 supported by the suction supporting sections 133a–133d. The transparent plate 131 is held by an openable frame 132 for vacuum suction. The transparent plate 131 is provided with through holes (not shown) at each location of the supporting sections 133a–133b.

Further, as shown in FIG. 27, the lower printing frame 116 (124) comprises a transparent plate 116b provided with a plural number of through holes 116a, a frame body 116c supporting the transparent plate 116b and a fitting section 116d for a suction hose 116e provided in the frame body 116c. Each row of the through holes 116a of the transparent plate 116b is communicated with each row of vacuum grooves 116f.

The work is transferred to the reverse stage by means of transferring means (not shown) to reverse said work from upper surface to under surface. The reversing mechanism applied in this reverse action is such one as disclosed in Japanese laid-open application published with publication number of 4-46445. The reverse unit comprises a delivery table to receive the work and to transfer the work to a predetermined position and a suction reverse unit to suck the work from the delivery table.

In the upstream unit 105 and the downstream unit 111 there are provided with control devices and ultraviolet rays irradiation devices, respectively. The ultraviolet rays irradiation device applies an ultraviolet lamp of 5 KW or thereabout. In conventional exposing apparatus, the ultraviolet lamp is not relighted. It is, therefore, always lighted during the operation and used for shutter mechanism of cameras, or the like. If ultraviolet rays is not required during operation the shutter mechanism is closed to cut the ultraviolet rays.

The order of processes of the exposing apparatus 110 including delivery, alignment, exposure and reverse of the works is as follows:

The work W is transferred to the alignment stage 102 by means of the handler 115 of the traverser 112 from the feed-in stage 101 of the upstream unit 105. The work held by the upper printing frame 113 and the lower printing frame 116 is aligned on the alignment stage 102. The upper printing frame 113 of the traverser 112 sucks the aligned work and the lower printing frame 116 to transfer them to the exposing stage 103. The work W exposed its one surface is transferred to the discharge stage 104 by the handler 114 of the traverser 112 and reversed its surface from upper surface to under surface at the reverse stage 106. Then it is transferred by a traverser (not shown) to the downstream unit. The operarion carried out in the upstream unit 105 is repeated in the downstream unit 105 and the other surface of the work W is exposed. The exposed work is then discharged.

According to the aforementioned processes an accurate alignment effect is obtained and productivity is improved.

However, there still remain some defects to be improved as follows:

(1) In the aforementioned exposing apparatus, the structure of traverser, direction of transfer, location of devices are all arranged in straight line, thus the size of the cleaning room to proceed exposing operation occupies large space.

(2) The exposing apparatus provides ultraviolet rays irradiation devices in its upstream and downstream units, respectively. Each of the upstream and downstream units is provided with control device, thus the size of the whole system becomes larger and consumption of electric power becomes larger.

(3) When transparent plate becomes deteriorated after long time use it is necessary to replace the transparent plate provided with mask or mask transparent plate. The upper printing frame is provided with a suction mechanism such as a suction hose to suck the work and suction pads, or the like. It causes troublesome to replace the suction mechanism. It is also required to stop whole processes of exposing working for several hours to replace the transparent plate.

(4) When vacuum suction by the lower printing frame to transfer the work is too tight between the work and the lower printing frame of the transparent plate, it is not possible to take off the work from the transparent plate and then operation is obliged to stop. The lower printing frame is provided with the suction hose and a plural number of the upper and lower printing frames to serve as vacuum frame are required. The structure which corresponds to such a new tendency is required.

(5) The work is held by the lower printing frame or held between the upper and lower printing frames to be transferred and exposed. It is required to transfer the work so that positional deviation amount of said work on the lower printing frame may become as small as possible.

(6) In arrangement of the reverse stage to reverse the work from upper surface to under surface it is required to provide a discharge stage in the upstream unit, reverse stage, and a feed-in stage in the downstream unit. This causes to prepare a larger working space.

(7) In order to proceed alignment and exposing works, the vacuum frame retaining the work is held between the upper printing frame and the lower printing frame. As the handler and the upper printing frame are integrally formed, the whole structure becomes larger and controlling the apparatus becomes troublesome. Maintenance work is also troublesome. The lower printing frame and the upper printing frame are not removed each other so they are not possible to be treated independently. Thus working efficiency is not improved.

(8) It is required to improve location of alignment of the vacuum frame and location of exposing the work so that more efficient exposing operation may be obtained.

(9) When the work placed on the lower printing frame is transferred to each stage the work is sometimes displaced with positional deviation from the predetermined location. It is desired to prepare more accurate aligning device in the subsequent stages.

SUMMARY OF THE INVENTION

The present invention has been made with the foregoing problems in mind and its object resides in providing an efficient exposing apparatus and accurate exposing method to reduce the space of the exposing operation of the exposing apparatus. It is possible to replace the upper printing frame when the upper printing frame is deteriorated. It is possible to suck the work or take off the work from the lower printing frame properly. The reverse device can reverse the work in accordance with a preliminary alignment without taking space. Thus control and maintenance operations are performed easily. Consumption of electric power is small and structure of the vacuum frame is compact and alignment of the work is efficient.

The apparatus of the present invention comprises an alignment table to transfer the work held by the lower printing frame to a proper position to perform locating operation, a first alignment stage provided with a camera to confirm the proper position, a first exposing stage to expose the aligned work, a reverse stage to reverse the exposed work from upper surface to under surface, an alignment table to transfer the work already reversed on the lower printing frame in the reverse stage to align a proper position, a second alignment stage provided with a camera to confirm the proper position, a second exposing stage to expose the aligned work, the first alignment stage, the reverse stage and the second alignment stage being arranged in straight line direction, each of said first and second alignment stages provides first and second exposing stages in perpendicular direction to the straight line direction, a ultraviolet rays stage is provided between said first and second exposing stages, a plural number of handlers to transfer the work on the straight line position from the first alignment stage to the second alignment stage, the upper and the lower printing frames of vacuum frame to proceed locating, transfer and exposing operation holding the work between the alignment stage and the exposing stage are provided with transferring means, respectively.

The method of the present invention comprises first preliminary locating process to preliminarily locate one surface of the work to be exposed, second process to locate the preliminarily located work being placed on and held by the lower printing frame by the first alignment table and a camera, third process to expose the preliminarily located work held by the upper printing frame together with the lower printing frame to transfer to the exposing section, fourth process to transfer the exposed work with the lower printing frame by means of transferring means to the first alignment table, fifth process to transfer the work on the first alignment table to the reverse device by the handler, sixth process to reverse upper surface to under surface to preliminarily locate the work by preliminary locating mechanism, seventh process to locate the work by means of the second alignment table and the camera holding said preliminarily located work, eighth process to transfer the located work holding the work together with the lower printing frame by the upper printing frame, ninth process to transfer the exposed work, said exposed work being held on the lower printing frame to the second alignment table by means of transferring means and tenth process to discharge the work whose upper surface and under surface are exposed on the alignment table.

The vacuum frame comprises an assembly of the upper and lower printing frames. More particularly, one upper printing frame and two lower printing frames, said upper and lower printing frames being provided with suction means, respectively. During confirmation operation of locating the work and exposing operation the upper and the lower printing frames are assembled by means of vacuum suction means to serve as a vacuum frame, locating and alignment of the work and transfer of the exposed work are proceeded by the vacuum frame in which the work is placed on the lower printing frame.

WORK OF THE INVENTION

The present invention offers the following workings:

(1) The work to be exposed is transferred by the handler in the straight line comprising the first alignment stage, the reverse stage and the second alignment stage. Next, the work is transferred as being held by either of the upper or the lower printing frame of the vacuum frame or sandwiched between the upper and the lower printing frames in the perpendicular direction to the straight line direction between the first alignment stage and the first exposing stage and between the second alignment stage and the second exposing stage.

(2) The vacuum frame comprises the upper and the lower printing frames. More particularly, the vacuum frame comprises one upper printing frame and two lower printing frames. When a pair of such upper and lower printing frames holding the work between them are proceeded exposing operation as a vacuum frame, another lower printing frame is carried its alignment operation on the alignment table. After exposing operation is completed the upper and the lower printing frames are separated and the upper printing frame is transferred to be assembled with another lower printing frame on the alignment table to confirm proper location. On the other hand, the lower printing frame separated at exposing section is transferred to the next processing stage by the traverser.

(3) One lower printing frame is provided on the alignment table and the other lower printing frame is provided in the next processing location. The two lower printing frames are circulated from the alignment table to the next processing location. Each lower printing frame is assembled with the upper printing frame to form the vacuum frame to proceed alignment and exposing operations.

(4) The work, after preliminary locating by the preliminary locating mechanism, is transferred to the alignment table by the handler and retained by one lower printing frame on the first alignment table. If location of the work is not proper and positional deviation is found by the camera, the work is relocated to a proper location by operation of the first alignment table. After locating operation on the lower printing frame is finished, the work is lifted by upward movement of the alignment table to be assembled with the upper printing frame transferred from the exposing location and it is again confirmed whether properly located or not. If the work is properly located it is transferred as a unit of vacuum frame to the exposing section. The work is exposed in the ultraviolet irradiation stage. The other lower printing frame located in the exposing section is moved on to the first alignment table by the traverser and locating operation of the next work is carried on the alignment table. The traverser turns back to the exposing section immediately after transferring the lower printing frame.

On the other hand, the work exposed its one surface on the lower printing frame is again transferred to the first alignment table as being held by the traverser. At this time the lower printing frame on the alignment table and next work have been transferred to the exposing stage as being held by the upper printing frame after the next work being confirmed location.

The exposed work transferred to the first alignment stage is transferred to the reverse stage by the handler to reverse its upper surface to under surface. Concurrently, preliminary locating is carried out. Then the work is transferred to the second alignment stage by the handler. The operations carried in the first alignment stage and the exposing stage are repeated and the reversed tinder surface of the work is exposed.

(5) The lower printing frame of the exposing apparatus is provided with a connecting part to contact with a hose connecting part of an air pump provided with a ball valve to suck the transparent plate. To retain the work on the lower printing frame vacuum suction is proceeded. The ball valve in the connecting body is placed near another opening portion of the connecting body and it does not disturb sucking action of the connecting part. When the work is displaced from the lower printing frame by means of suction, the ball valve is located to the other opening portion and it does not close the opening portion. When the upper and the lower printing frames are assembled and vacuum suction of the upper printing frame is proceeded, the other opening portion of the connecting body of the lower printing frame is closed by the ball valve and a tight vacuum suction of the upper and the lower printing frames holding the work between them is performed.

(6) The work placed on the lower printing frame is held by the lower printing frame because the connecting parts to communicate with suction through holes of the work of the lower printing frame are correspondingly contacted to each connecting part of a lifting table, the traverser and the alignment table to make suction by air pump possible. When the lower printing frame is transferred from the lifting table to the traverser and from the traverser to the alignment table, the air sucked from the connecting parts where the connecting part of the traverser is correspondingly communicated with one connecting part of the lower printing frame to hold the work to the lower printing frame is stopped. The work transferred to the alignment table is held by the holding means of the alignment table. At this time each of the connecting parts of the lower printing frame and each of the connecting parts of the alignment table is corresponded. The work is thus displaced from the lower printing frame by air suction.

(7) The alignment table is performed its locating operation of the work by moving X, Y and θ tables holding the lower printing frame together with the work placed thereon. The lower printing frame with the work is moved upwardly by the lifting mechanism to contact to the upper printing frame. When receiving the exposed work together with the lower printing frame from the traverser the work is moved upwardly by means of the lifting mechanism after the traverser holding the lower printing frame arrived at the alignment table, the work is held together with the lower printing frame and each of the connecting parts of the work is corresponded with each of the connecting parts of the lower printing frame. The work is displaced by exhausting air by means of the pump.

(8) The upper printing frame of the exposing apparatus is provided with vacuum suction pads to suck the frame which supports the transparent plate. The vacuum suction pads and the frame are easily displaced from the tranparent plate.

(9) The lifting table is lifted to receive the work from the handler in the reverse stage. The lifting table is desended to hand the work to the reverse device. The work handed to the reverse stage is reversed its surface from upper surface to under surface there and then preliminary locating is carried out by the prealignment mechanism.

(10) In the reverse stage a rotatable supporting section of the suction supporting arm is rotated to keep uprightly the suction supporting arm to the basic horizontal line. Said rotatable supporting section is transferred as it is kept horizontally along the base line of the reverse stage by the predetermined distance to the other end of the reverse stage. The rotatable supporting section located at the other end of the reverse stage is again rotated to place the reversed work to the lifting table. The surface of the work is reversed.

(11) The ultraviolet rays irradiated from the light source is forwarded to a change-over mirror through a flat reflector and a flyeye lens. The change-over mirror received the ultraviolet rays changes angle of direction of the ultraviolet rays by predetermined degree to reflect the light so that the light is forwarded to the exposing stage properly.

(12) The handlers are constructed with flat contacting surface to accurately support the sucked work horizontally. The work is sucked and supported quite horizontally in spite of its thickness.

(13) One lower printing frame is provided on the alignment table. The other lower printing frame is provided in the next processing stage (the exposing section or the discharge section in accordance with construction of the exposing apparatus). The lower printing frame on the alignment table is supported holding the work. After alignment operation has been done, the lower printing frame is lifted with lifting motion of the alignment table. The lower printing frame together with the work is displaced from the alignment table and forwarded to the next processing stage by the traverser. On the other hand, the other lower printing frame in the next processing stage is transferred to the alignment table by the traverser. Accordingly, two lower printing frames are circulated between the alignment table and the next processing stage.

BRIEF DESCRIPTION OF THE DRAWINGS

FIG. 9 is a part of cross-sectional view showing the upper printing frame and the lower printing frame sucked together.

FIG. 10 is a part of cross-sectional view of the lower printing frame according to the present invention.

FIG. 11 is another part of cross-sectional view of the lower printing frame according to the present invention.

FIG. 25 (b) is a side view showing connecting state of the upper and lower printing frames according to the present invention.

DETAILED DESCRIPTION OF THE PREFERRED EMBODIMENTS

Now the present invention is explained hereunder with reference to the accompanying drawings.

Figure 1:
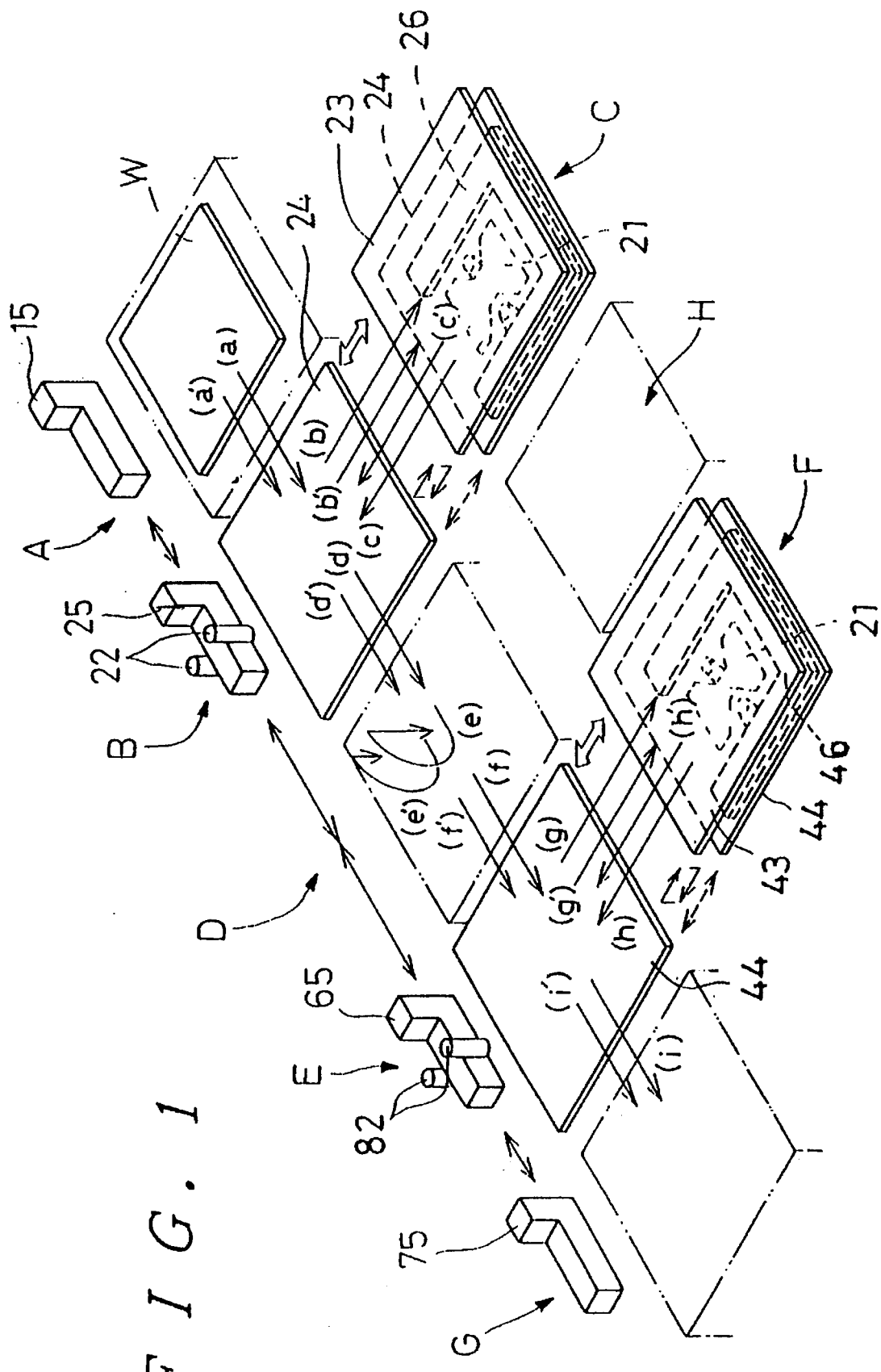
FIG. 1 shows an outline of the exposing apparatus and order of process of the work according to the present invention.
Figure 2:
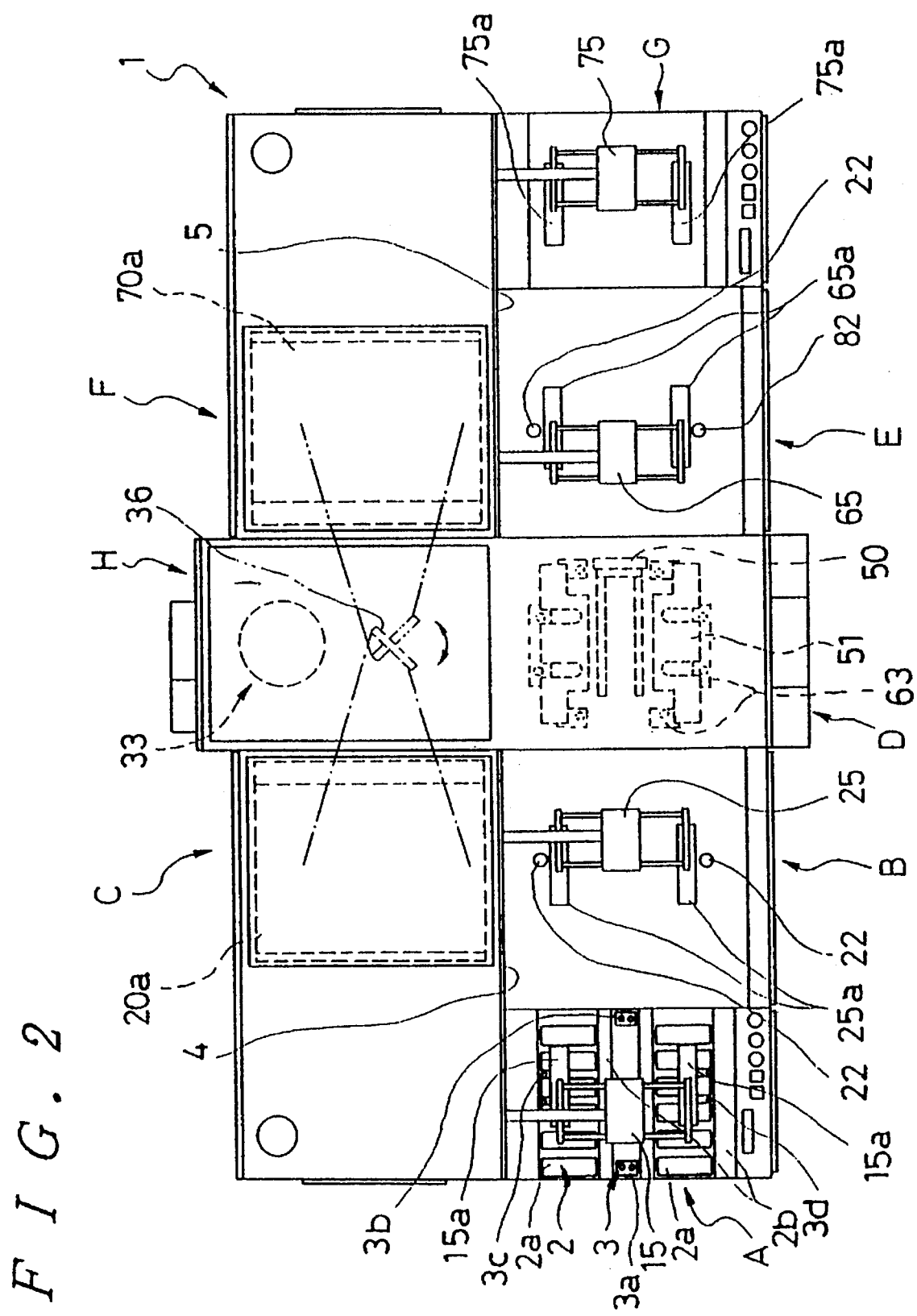
FIG. 2 is a plan view showing the exposing apparatus according to the present invention.
Figure 3:
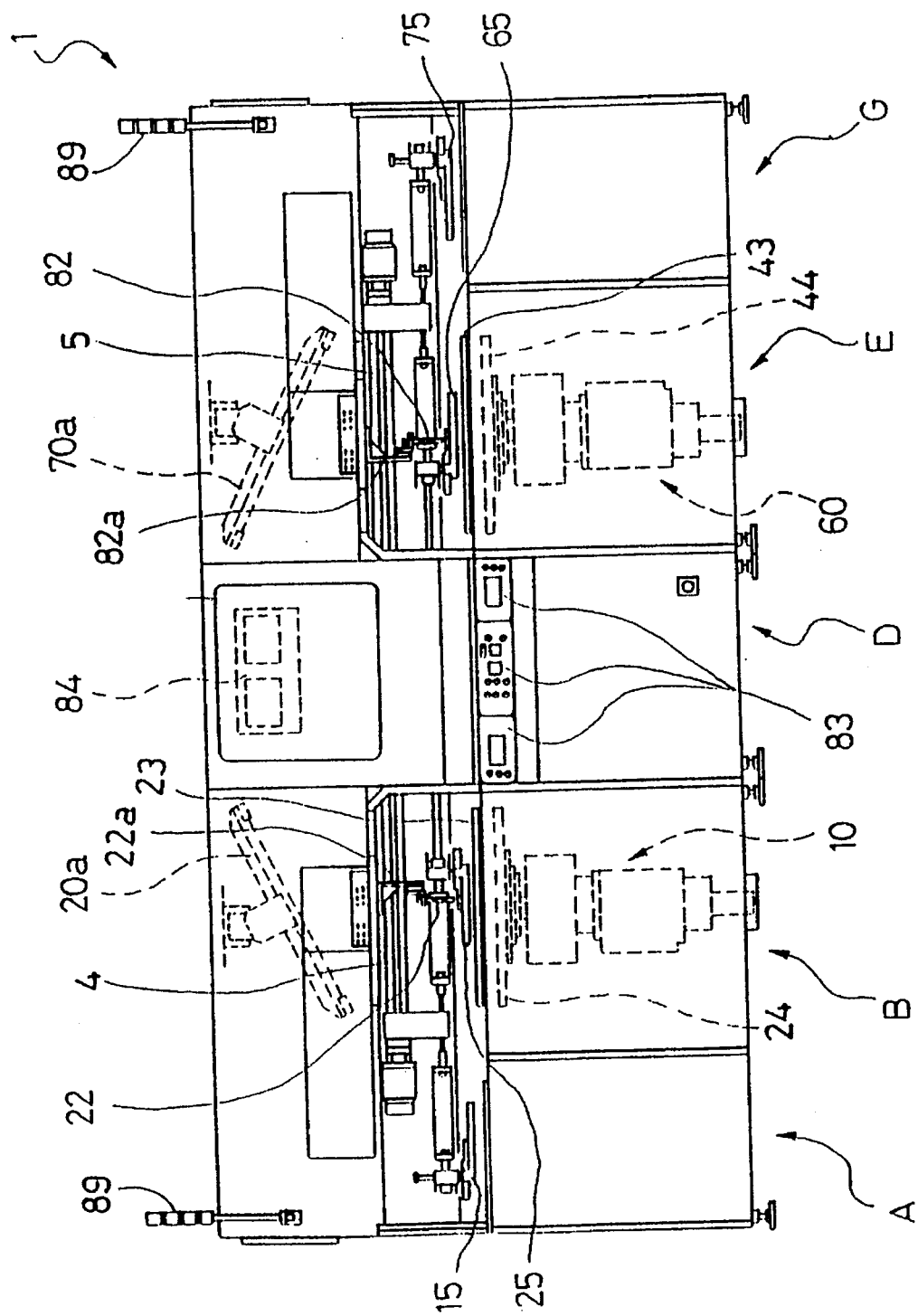
FIG. 3 is a front view showing the exposing apparatus according to the present invention.
Figure 4:
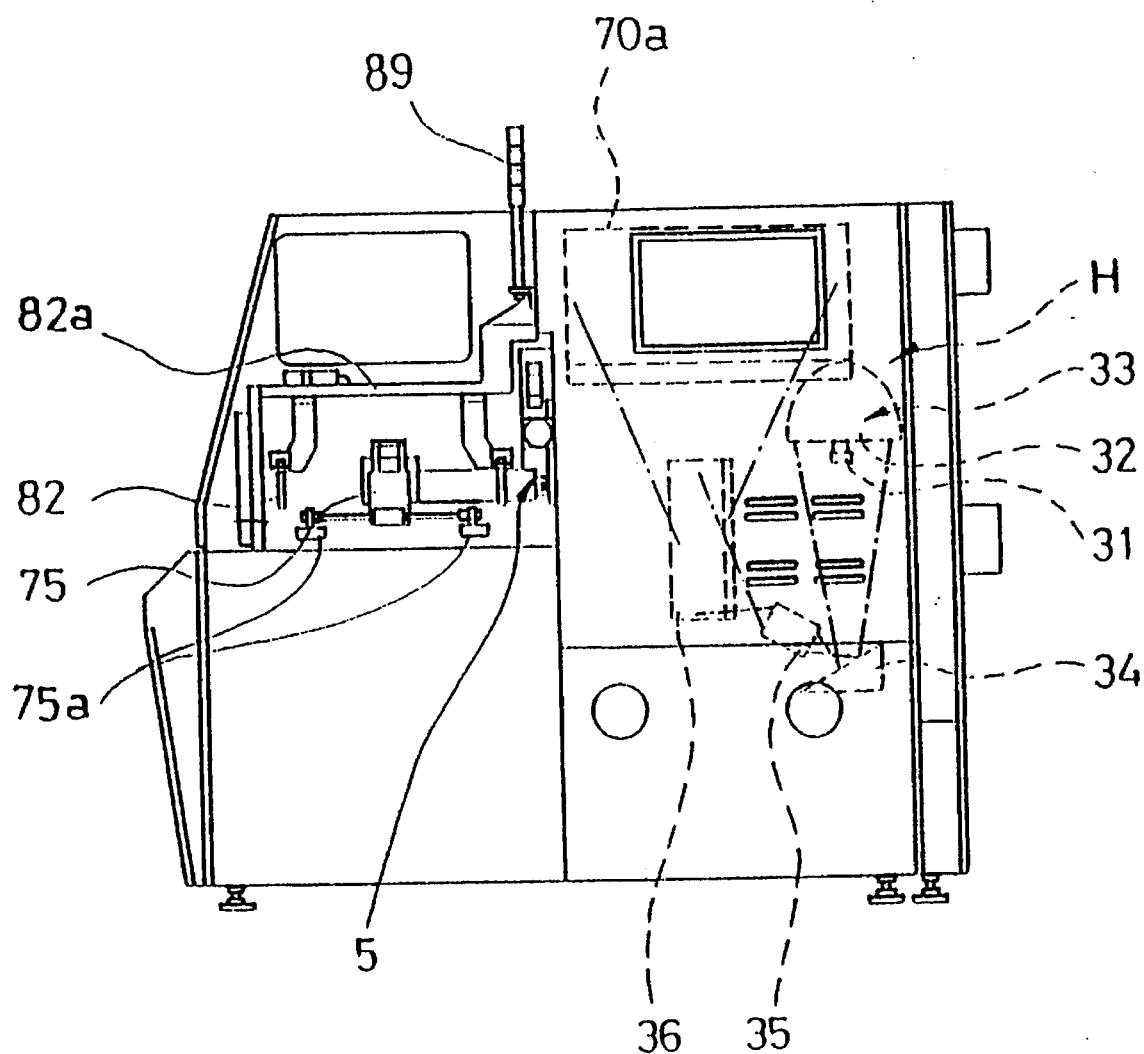
FIG. 4 is a side elevational view of the exposing apparatus according to the present invention.

FIG. 1 is a principle explanation of the whole exposing apparatus. FIG. 2 is a plan view of the whole exposing apparatus. FIG. 3 is a front view of the whole exposing apparatus. FIG. 4 is a side view of the exposing apparatus.

As shown in FIG. 1 each stage of the exposing apparatus is arranged in a straight line manner such that from a feed-in stage A, a first alignment stage B, a reverse stage D, a second alignment stage E to a discharge stage G. On the other hand, a first exposing stage C and a second exposing stage F are provided facing to the first alignment stage B and to the second alignment stage E, respectively. These first and second alignment stages are arranged perpendicularly to the straight line from the feed-in stage A to the discharge stage G. A ultraviolet rays irradiation stage H is provided between the first exposing stage C and the second exposing stage F.

As shown in FIGS. 1–3, there are provided a prealignment mechanism 3 and rollers 2 for preliminary location of a work in the feed-in stage A. In the first alignment stage B (the second alignment stage E), there are provided an alignment table 10 (60) and one lower printing frame 24 (44). In the exposing stage C, there are provided a large reflector 20a (70a), an upper printing frame 23 (43), the other lower printing frame 24 (44), a delivery means 26 (46) supporting said other lower printing frame 24 and a supporting table 21

(21). In the reverse stage D, there are provided a reverse device 50, a lifting table 51 and a prealignment mechanism 63. In the ultraviolet rays irradiation stage there is provided a light source 33 and other reflectors and mirrors to lead the ultraviolet rays to a predetermined direction.

As shown in FIG. 1, there are provided the delivery means to feed or transfer the work to each stage. The delivery means comprises handlers 15, 25, 65, 75, the first alignment stage B, the second alignment stage E, the two lower printing frames 24, (24), 44, (44) and the upper printing frame 23, (46) provided between the first exposing stage C and the second exposing stage F, and transferring means.

Figure 12:
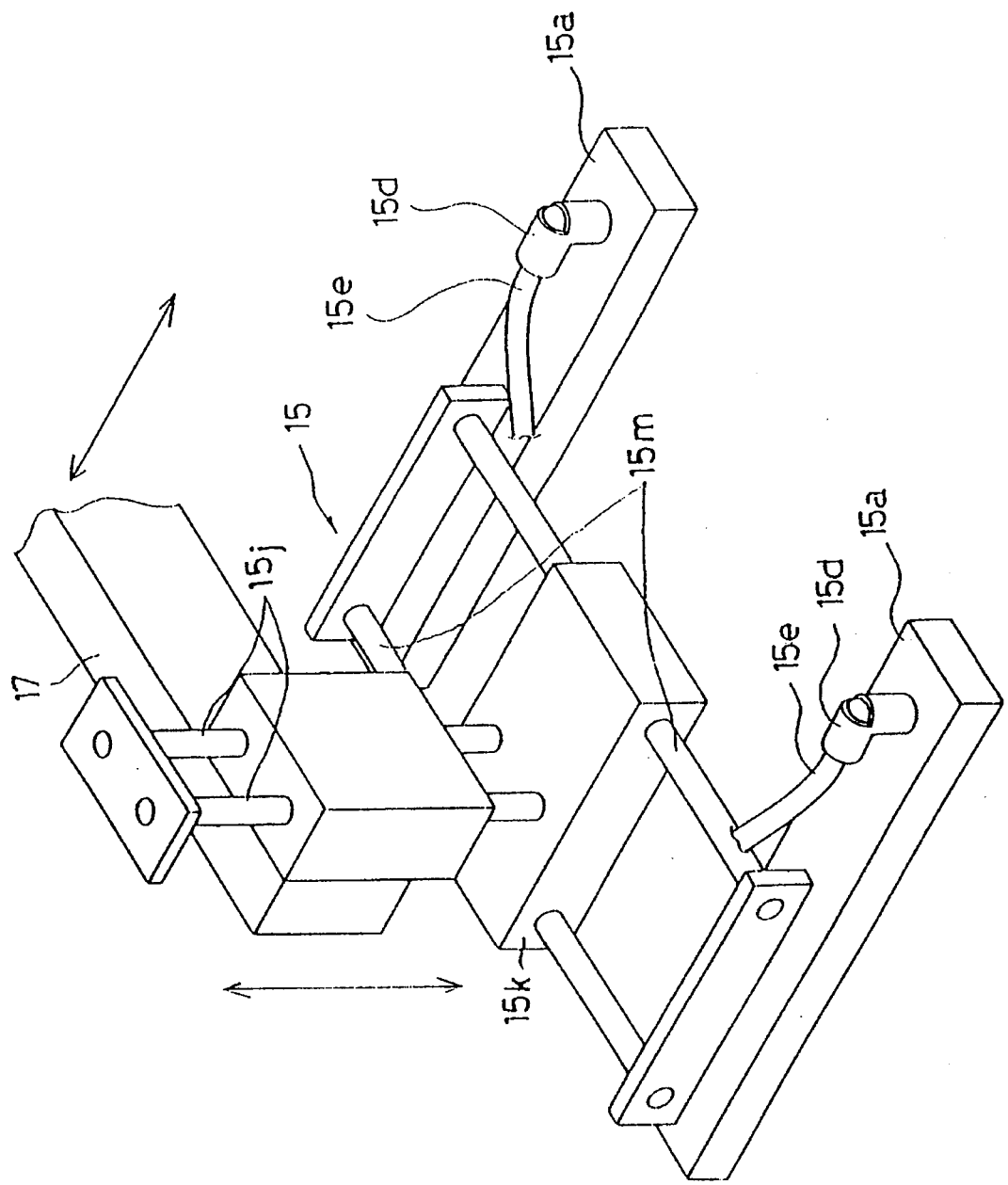
FIG. 12 is a perspective view showing the handler according to the present invention.

Next, construction of each stage is described in detail. As shown in FIG. 12, the handler 15 comprises a support arm 17 to which a lift guide bar 15j is retained by a lift driving part 16, said lift guide bar 15j being provided with suction parts 15a, 15a through a support portion 15k and a horizontal guide bar 15m at the lower portion. The handlers 15 . . . are moved along delivery grooves 4, 5 provided along the straight line from the feed-in stage A to the discharge stage G as shown in FIG. 3 and FIG. 4.

Figure 13:
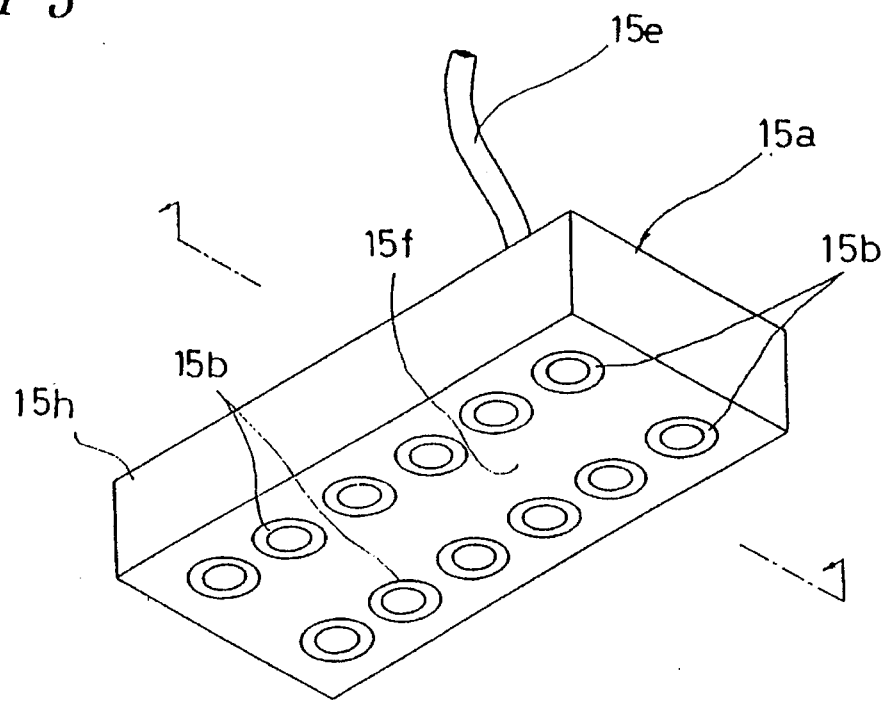
FIG. 13 is a perspective view showing a suction part of the handler according to the present invention.
Figure 14:
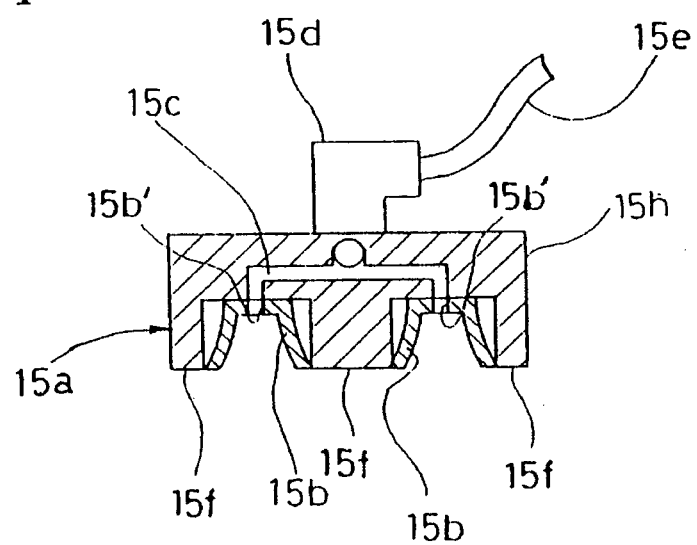
FIG. 14 is a cross-sectional view of the suction part of the handler according to the present invention.

As shown in FIG. 13 and FIG. 14, each vacuum suction part 15a, 15a of the handler comprises a box body 15h, a plural number of vacuum suction pads 15b having opening portions 15b' provided in the fitting hole of the under surface of the box body 15h, an air passage 15c communicating to the opening portions 15b' of the vacuum suction pads and a fitting portion 15d of a suction hose 15e provided at other end of the air passage 15c. The vacuum suction pads 15b having the same configuration as the under surface of the box body 15h are provided on the work contacting surface of said vacuum suction pads 15a. The vacuum suction pads 15b are made of elastic materials such as rubber, synthetic rubber, or the like.

Accordingly, the opened portions of the vacuum suction pads 15b are placed flatly just on the same under surface of the box body 15h as shown in FIG. 13. For this reason the work is not distorted even if the thickness of the work is thin. It is also possible to make the depth of the fitting holes of the under surface of the box body 15h shallow so that the thin work may not be distorted by vacuum suction. In this case the vacuum suction pads 15b are not required. Distance between the vacuum suction parts 15a, 15a is regulated by changing the fitting length of an expandable horizontal guide bar 15m fitted to a retaining section 15k of the handler.

Next, as shown in FIG. 2, rollers 2 comprises a plural number of the feed rollers 2a, a roller support section 2b and a transmission section (not shown) to drive the feed rollers 2a by means of a motor. The work coming from a feed-in stocker (not shown) is accurately placed on the predetermined position of the rollers 2. The rollers 2 are driven by the motor to feed the work and the work is stopped always at the predetermined position on the rollers 2 by means of a sensor. There is provided a prealignment mechanism 3 at the predetermined position of the rollers 2. The prealignment mechanism 3 is the same one as provided in the reverse stage D.

As shown in FIG. 3, the first alignment stage B and the second alignment stage E are provided with the alignment tables 10 (16) and cameras 22 (82) to confirm location of the work W, respectively.

Figure 5:
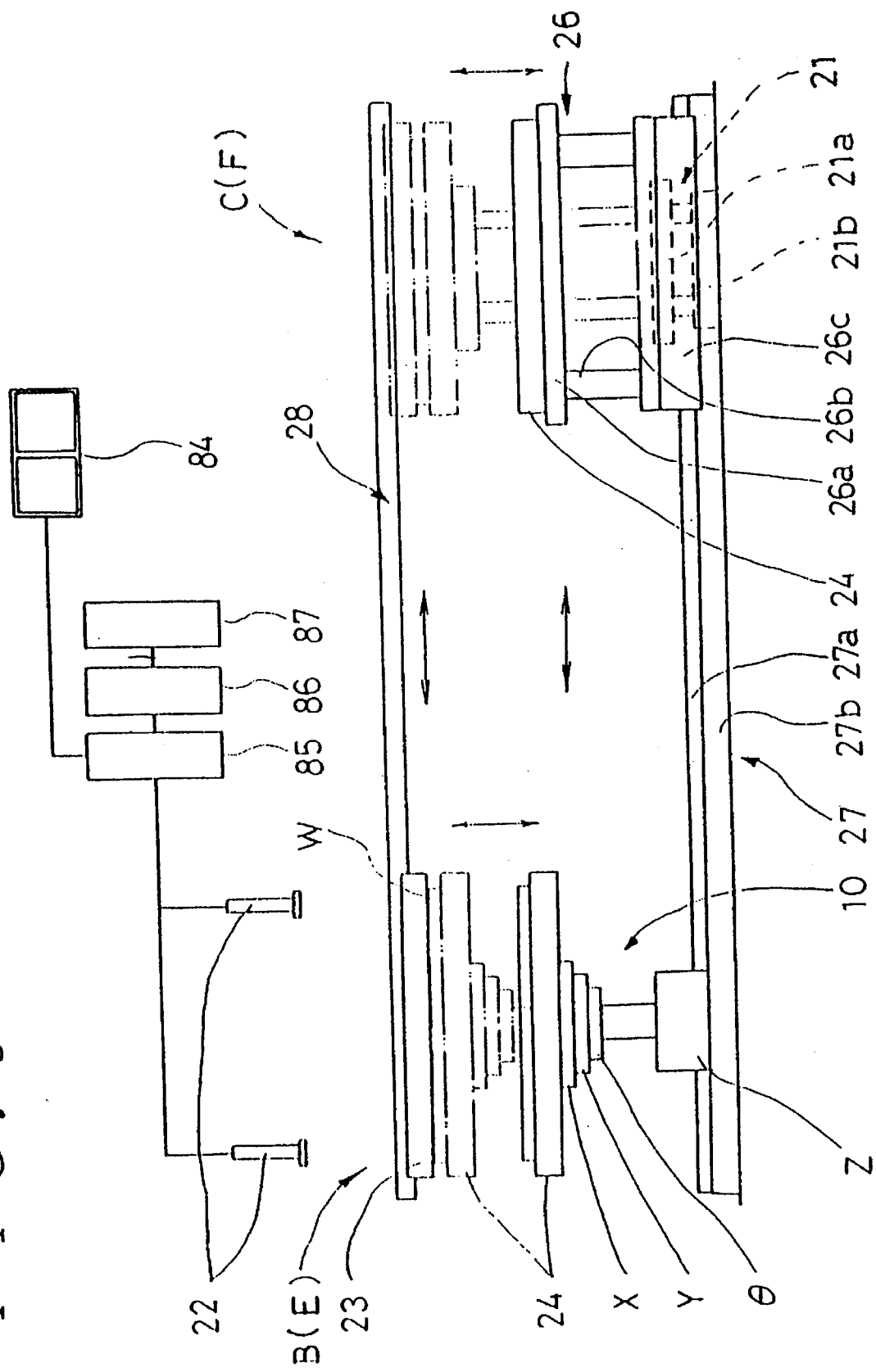
FIG. 5 is a principle explanation view illustrating alignment stage and the exposing stage according to the present invention.
Figure 6:
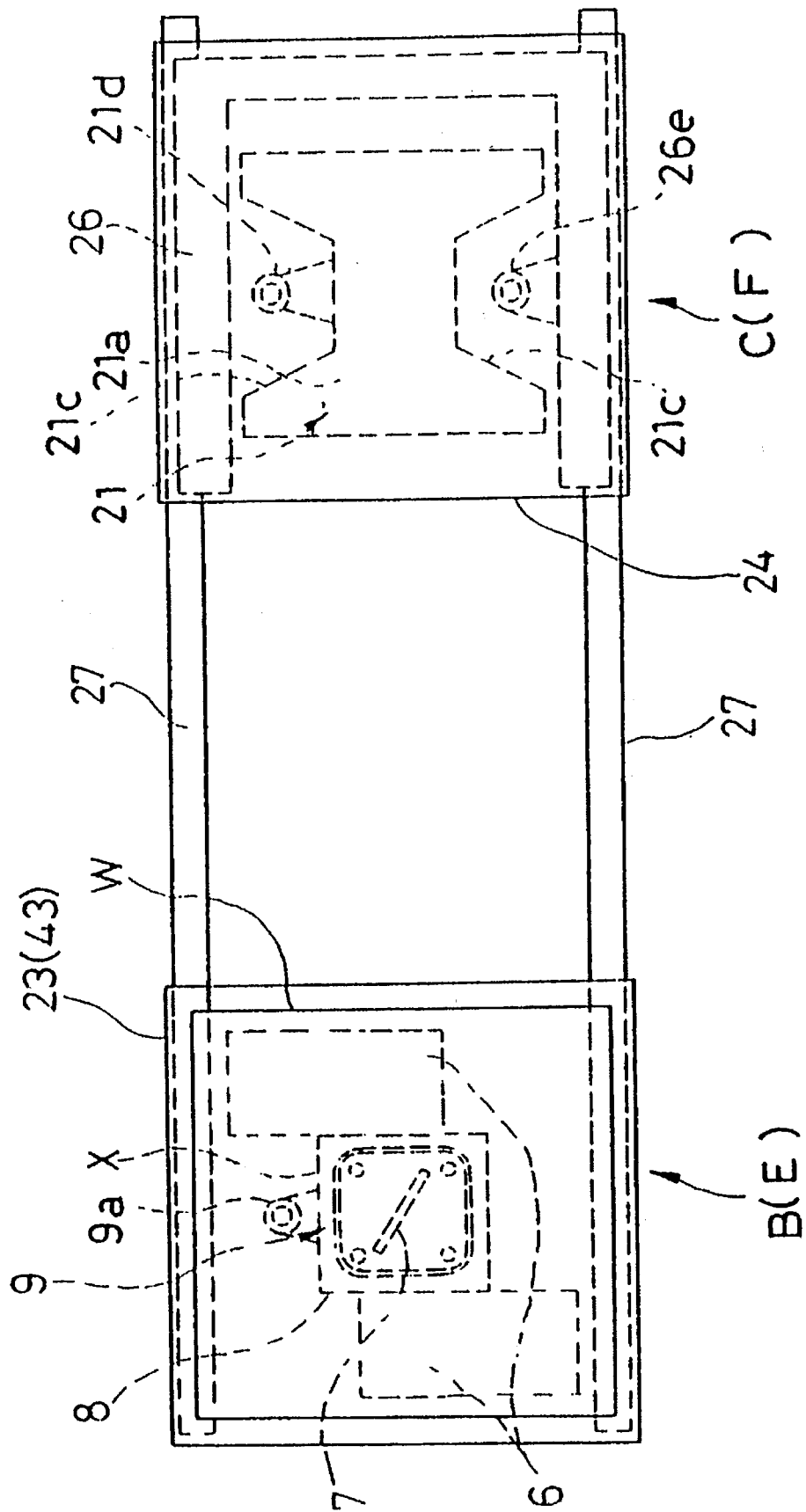
FIG. 6 is a plan view showing the lower printing frame being transferred between the alignment stage and the exposing stage according to the present invention.

The alignment tables 10 (60), as shown in FIG. 3 and FIG. 5, comprises an X table movable in X coordinate direction, a Y table movable in Y co-ordinate direction, a θ table rotatable around the perpendicular line and a Z section having vertical lifting mechanism. As shown in FIG. 6, the X table is provided with a retaining means 9 for vacuum suction to retain the lower printing frame 24 on the X table and a connecting part 9a corresponded with a connecting part 45 of the lower printing frame 24. The alignment table 10 is constructed such that the level of the work on the alignment table when the Z section is not worked is lower than the level of the position of the work on the delivery means 26.

The retaining means 9 is provided with a suction groove 7 and a seal rubber 8 of rectangular pattern surrounding the suction groove 7. The suction groove 7 is connected to an air pump through communication hose (not shown). The suction groove 7 is of course replaced with a plural number of opened holes, if required.

The connecting part 9a is provided on the side of the X table. The level of the connecting part 9a is a little lower than the face of the X table so that the lower printing frame can be sustained on the X table when the lower printing frame comes to the X table. The connecting part 9a is provided with an annular rubber pad on its surface and is connected to hose and air pump (not shown).

The illumination tables 6, 6 are provided at left and right sides on the X table. The illumination tables are used to illuminate locating holes of the work (not shown) and locating marks of a mask film during exposing operation.

As shown in FIG. 3 and FIG. 4, cameras 22 (82) to confirm proper position of the work are provided on support bars 22a (82a) on the alignment tables 10 (60). The cameras 22 (82) can change their position on the support bars 22a to correspond to the size of the work to regulate the distance between the cameras 22, 22. When the support bars 22a are arranged in parallel line, the cameras are fitted differently, e.g., at opposite ends of the support bars, respectively.

An alignment condition of the work W taken by the camera with the mask film M is watched by a monitor 84 as shown in FIG. 3. Judgement whether the locating mark (through holes) is properly set or not is made by comparing a data previously inputted in a control section 86 with positional deviation amount of the locating mark of the work W taken by the camera 22. If the locating mark of the work is not properly set, a signal from the control section 87 is issued to compensate said positional deviation amount of the work of the X, Y and θ tables.

After alignment working is completed it is required to confirm location of the mask film M and the work W by means of camera 22 holding the upper and lower printing frames 23 and 24. Accordingly, exposing operation is carried out without positional deviation amount of the locating mark of the work W.

The ultraviolet rays irradiation stage H comprises an ultraviolet rays lamp 31, an elliptical reflector 32, a plane reflector 34, a flyeye lens 35, a change mirror 36, and large reflectors 20a and 70a. The ultraviolet rays lamp 31 and the elliptical reflector 32 form a light source unit 33. The ultraviolet rays from the light source unit 33 is reflected by the plane reflector 34 to change the ultraviolet rays to a predetermined direction. The flyeye lens 35 regulates illuminance of the ultraviolet rays reflected by the plane reflector 34. The ultraviolet rays from the flyeye lens 35 is reflected to two directions by the change mirror 36, one is lead to the large reflector 20a in the exposing stage C and the other to the large reflector 70a in the exposing stage F.

The ultraviolet rays from the light source 33 in the ultraviolet rays irradiation stage H is directed to the plane reflector 34 whose inclination angle $\alpha_1$ being set as 25 degree, and an inclination angle $\alpha_2$ formed by the ray from the light source 33 and the reflected ray to the change mirror 36 from said plane reflector 34 is set as 50 degree. The ray reflected by the large reflector 20a in the exposing stage C falls down vertically to expose the work W. The direction of the ultraviolet rays is shown by arrows in FIG. 15.

The first exposing stage C and the second exposing stage F are provided with the large reflectors 20a (70a), respectively, in their upper locations. As shown in FIG. 6, the upper printing frames 23 (43) located just under the large reflector 20a (70a) are provided movably to the alignment stage B. One of the two lower printing frames 24 is placed on the delivery table. The lifting tables 21 (21) to hand over the exposed work W to the delivery means 26 are located just under the delivery table. The delivery means 26 is provided with the tranferring mechanism 27 movably set between the alignment stage B (E) and the exposing stage C (F).

Figure 7:
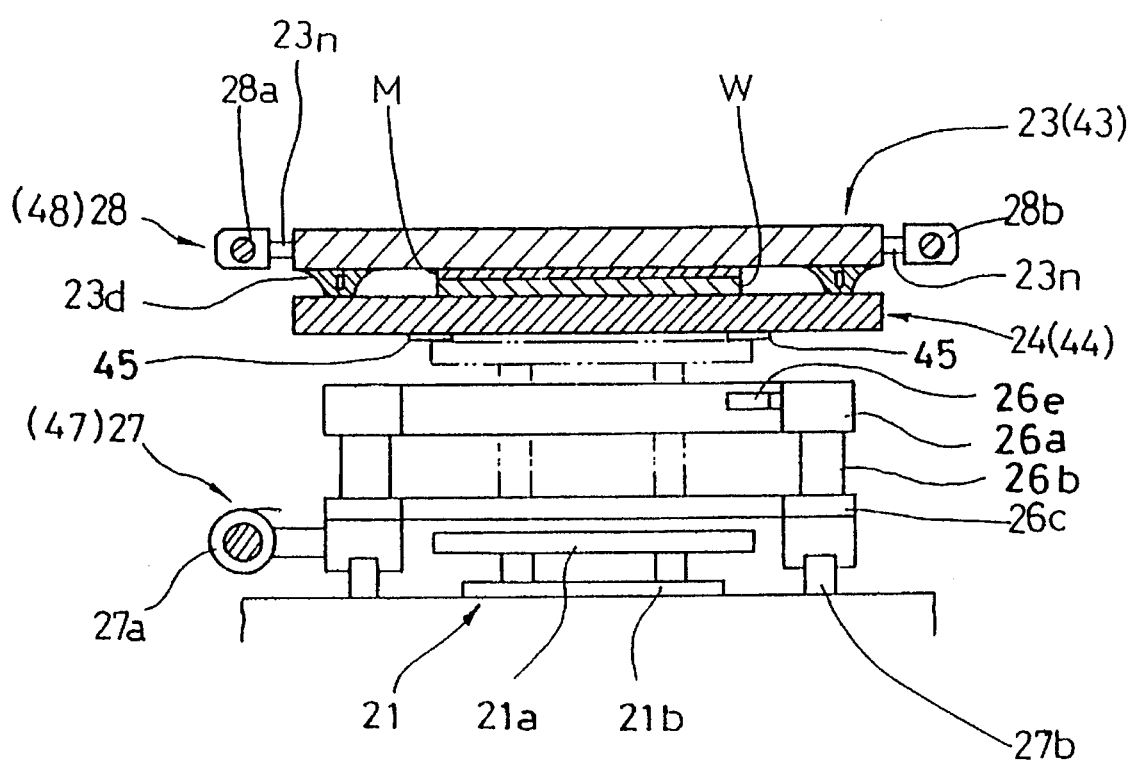
FIG. 7 is a part of cross-sectional view showing a locational relation between the upper and lower printing frames, a moving table and the traverser, respectively, at the exposing stage according to the present invention.

The delivery table (means) 26, as shown in FIG. 6 and FIG. 7, comprises a table 26a of ] configuration, a support table 26c to support the table 26a and a contacting part 26e to contact to a conneting part 45 provided under the lower printing frame 24. The contacting part 26e is provided with an annular rubber pad on the top and connected to an air pump. The delivery table 26 is constructed with an air cylinder 27a provided along the line between the exposing stage B and the alignment stage C and a transferring mechanism 27 comprising a linear guide 27b and a support table 26c. The delivery table 26 is transferred between the exposing stage B and the exposing stage C. As the delivery table 26 is transferred, the lifting table 21 when it is descended comes under the level of the support table 26c so as not to prevent the delivery table from being transferred.

Figure 15:
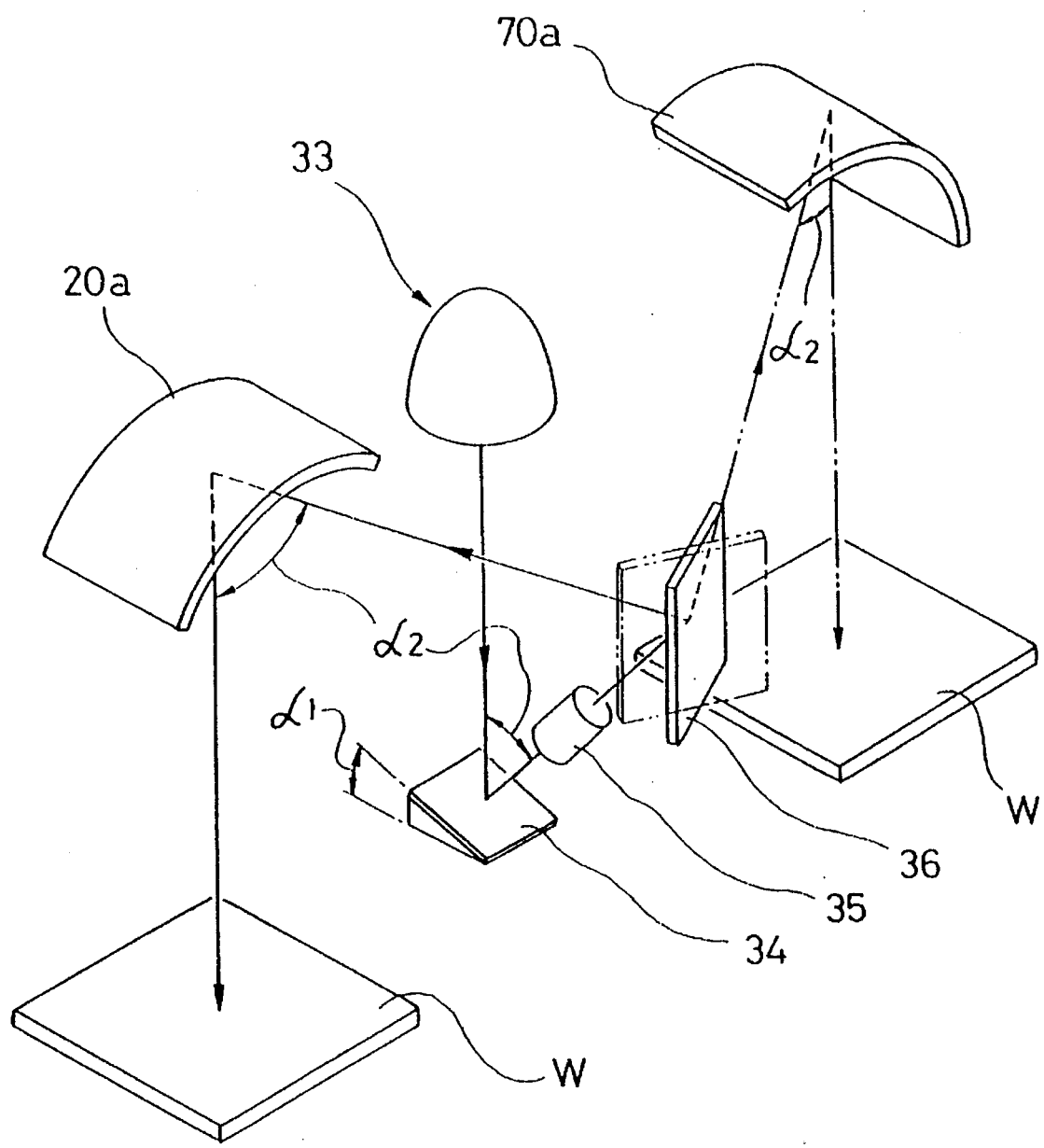
FIG. 15 is a perspective view showing structure of the ultraviolet rays irradiation stage according to the present invention.

The lifting table 21, as shown in FIG. 15 and FIG. 6, comprises a table 21a to place the printing frame, a cylinder unit 21b (shown in FIG. 7) to lift up and down the table 21a, and a communication part 21d protruded from one side of a notched part 21c. The communication part 21d is provided with an annular rubber pad on the top and connected to an air pump through a hose. Location of the communication part 21d is separated from location of a connecting part 9a of the X table. A connecting part 45 and the communication parts 9a, 21 are correspondingly contacted. The lower printing frame 24, as shown from FIG. 9 to FIG. 11, comprises a transparent plate 24a provided with a plural number of through holes 24b and another transparent plate 24e provided with a hole 24d. The transparent plates 24a and 24e are plied each other. The transparent plate 24a is provided with a groove 24c through which air from the through holes 24b is flowed in and out. At the location of the hole 24d of the transparent plate 24e a plural number of connecting parts 45 are provided. The connecting parts 45, 45 correspond to the communication parts 9a,21d and 26e.

The connecting part 45 of the lower printing frame 24, as shown in FIG. 9–FIG. 11, comprises a connecting part body 45a provided with free space for a ball valve 45b and a plural number of opened holes 45c whose diameter is smaller than that of the ball valve 45b provided under the connecting part body 45a. There is provided a recess 45d to receive the ball valve 45b under the connecting part body 45a.

On the other hand, the upper printing frame 23, as shown in FIG. 7, is provided to be transferred between the alignment stage B and the exposing stage C by means of linear guides 28a and 28b via fitting portions 23n, 23n.

Figure 8:
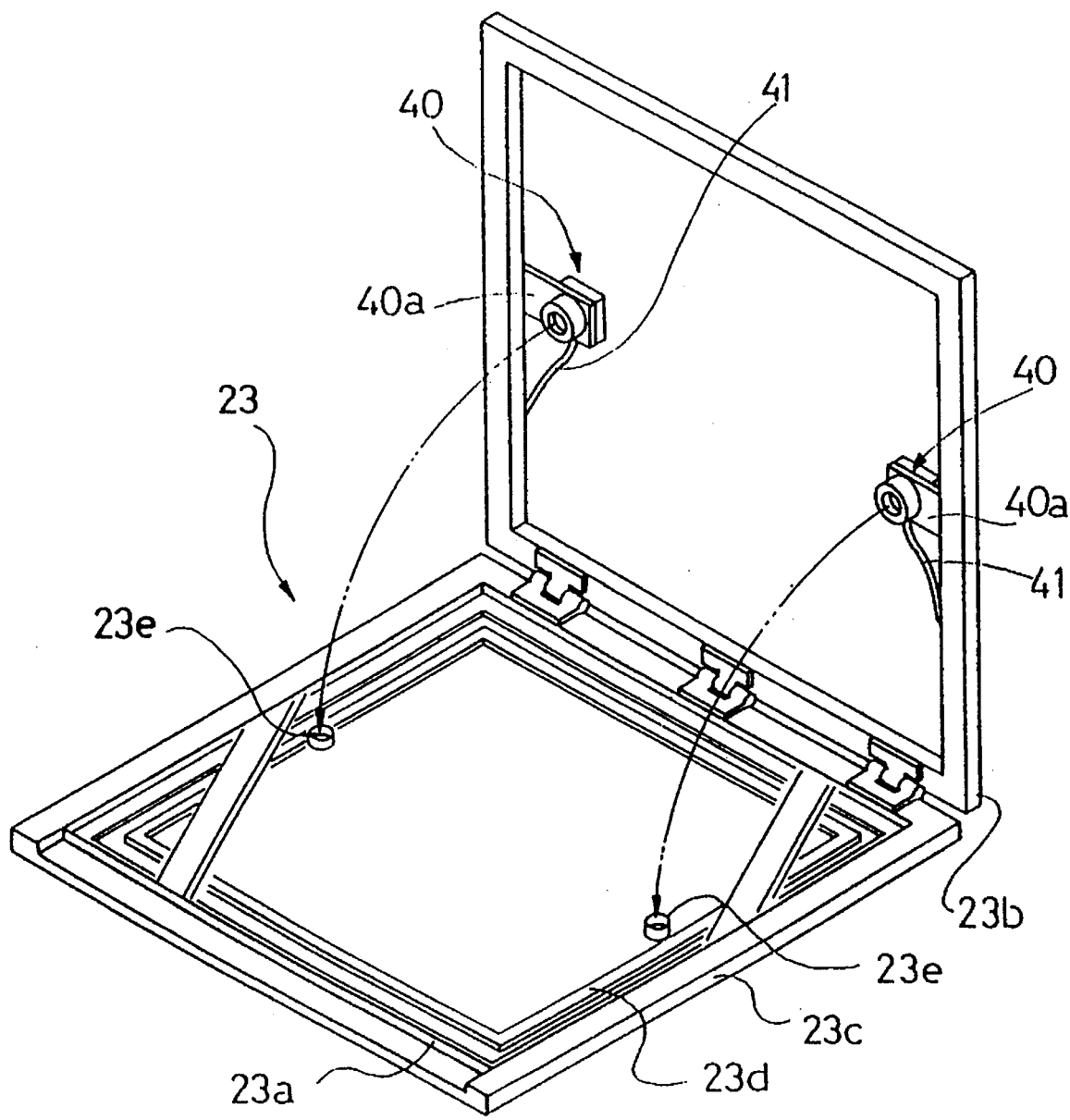
FIG. 8 is a perspective view showing structure of the upper printing frame according to the present invention.

The upper printing frame, as shown in FIG. 8, comprises a transparent plate 23a and upper and lower frames 23b, 23c sandwiching the transparent plate 23a between them. At the two sides of the frame of the transparent plate 23a there are provided through holes 23e, 23e to vacuum suck the work W. There is provided a seal rubber 23d surrounding the sides of the work. The suction mechanism such as a suction groove 23f to vacuum suck the mask film M is provided on the transparent plate 23a and a frame 23b. (If a glass dry plate is applied, a vacuum suction mechanism for the mask film M is not required.)

As shown in FIG. 8 and FIG. 9, the frame 23b is provided with connecting pads 40, 40 for vacuum suction through a fitting arm 40a. The connecting pads 40, 40 are located to assure to correspond to the through holes 23e, 23e of the transparent plate 23a when the frame 23b holds the transparent frame 23a. Hoses 41, 41 connected to the connecting pads 40, 40 are fitted by means of fitting equipments. As shown in FIG. 9, the connecting pad 40 is provided with a connecting part 40b made of elastic material such as rubber or the like to contact the transparent plate 23a and a spring 40c is fitted to support the connecting part 40b. The upper and the lower frames 23b, 23c are fitted by means of bolts or the like at opposite side against the hinges. It is of course possible to house the hoses 41, 41 inside the upper frame 23b.

When the transparent plate 23a is replaced an operator displaces the bolts to open the upper frame 23b. The upper frame 23b is opend by means of the hinges. The transparent plate 23a is slidably taken out from the frame 23b and a new one is placed. Replacement work is performed very easily. It is of course possible to fit the mask film M by means of tape instead of applying suction groove 23f.

Exposing operation is carried out in a clean room. The air is always dehumidified in the room. If the air is over dried, it sometime causes to distort the mask film M. It also causes to generate static electricity. These problems cause trouble on the way of transfer of the work. In order to avoid such troublesome some nozzles of dehumidifiers are protruded in each exposing stage C and F to keep the humidity of the air in the room properly. As the mask film tends to distort its shape in the exposing stage due to the heat of the upper printing frame which always receive the ultraviolet rays from the light source. Accordingly, cold wind is blown to the upper printing frame. Some antistatic electricity means are applied to prevent generation of static electricity in the clean room.

As an antistatic electricity means, an ionized air is applied. Plus and minus ionized air is blown through nozzles in the exposing stage to neutralize the air with static electricity generated by close contact of the mask film M and the work.

As aforementioned, the upper and the lower printing frames 23, 24 can retain and transfer the work W by the suction mechanism and to keep positional deviation amount of the work least during transfer operation between stages.

When suction operation from the connecting part 9a of the alignment table is stopped and concurrently suction operation through the connecting pad 40 of the upper printing frame 23 is started, the air in the space surrounded by the transparent plate 23a, the seal rubber 23d and the lower printing frame 24 is sucked. The ball valve 45b of the connecting part 45 of the lower printing frame 24 is absorbed to the through hole 24d of the transparent plate 24e to close the through hole 24d for the suction of the air. Thus the work W is retained between the upper printing frame 23 and the lower printing frame 24 (when the work is transferred from the alignment stage 8 to the exposing stage C).

When the work is transferred from the exposing stage to the delivery table the order of operation is as follows. As shown in FIG. 5 and FIG. 10, the lifting table is moved upwardly to correspond to the connecting part 26e with one connecting part of the lower printing frame 24 and suction operation of the upper printing frame 23 is stopped. Concurrently, suction operation of the connecting part 21d is started and the ball valve 45b of the connecting part 45, as shown in FIG. 10, is released to fall down through the through holes 24d of the transparent plate 24d and the air is sucked through the opened hole 45c of the connecting part body 45a as shown by arrow. The ball valve 45d fits in the recess 45d of the connecting part body 45a and does not disturb the suction operation. The work W is absorbed and held by the transparent plate 23 of the lower printing frame 24.

When the lower printing frame 24 is transferred from the lifting table 21 to the delivery table 26, the air is sucked from the connecting part 26e side immediately at the moment when the connecting part 26e of the delivery table 26 corresponds to the other connecting part (not shown). The connecting part 21d of the lifting table 21 stops air suction.

After the delivery table is transferred, the lower printing frame 24 is again transferred to the alignment table 10 and the work W is displaced from the lower printing frame 24. As shown in FIG. 6, the delivery table comes to the location of the alignment table 10 holding the lower printing frame 24. The Z axis section of the alignment table 10 is lifted up. The under surface of the work contacts to the retainig means 9 of the X table. When the other connecting part of the lower printing frame 24 contacts to the connecting part 9a the air suction of the connecting part 26e at the side of the delivery table 26 is stopped. Concurrently, the retaining means 9 starts suctioning action and air is blown out from the connecting part 9e.

The air, as shown by arrows in FIG. 11, is blown out from each of the through holes 24b of the transparent plate 24a through the through holes 24d of the transparent plate 24e to displace the work W from the transparent plate 24e. The suctioning and blowing action of the air and change of the action thereof are performed by means of air pump and solenoid valves (not shown in the figure).

The transfer, locating and exposing of the work W between the stages B and C and between the stages E and F are performed in the same manner. The same explanation between the stages E and F is therefore omitted.

Exposing operation is carried out in the clean room. The air is always dehumidified in the room. If the air is over dried, it causes to distort the mask film M. It also causes to generate static electricity. These problems cause trouble on the way of transfer of the work. In order to avoid such troublesome some nozzles of dehumidifiers are protruded in each of the exposing stages C and F to keep the humidity of the air properly. The mask film tends to distort the shape due to the heat of the upper printing frame which always receives the ultraviolet rays from the light source in the exposing stage. Accordingly, cold wind is blown to the upper printing frame. Some antistatic electricity means are applied to prevent generation of static electricity in the clean room. Next, construction and operation in the reverse stage D is explained. The work W transferred to the reverse stage D from the alignment stage B by the handler 25 is reversed from upper surface to under surface by the reverse device 50.

Figure 16:
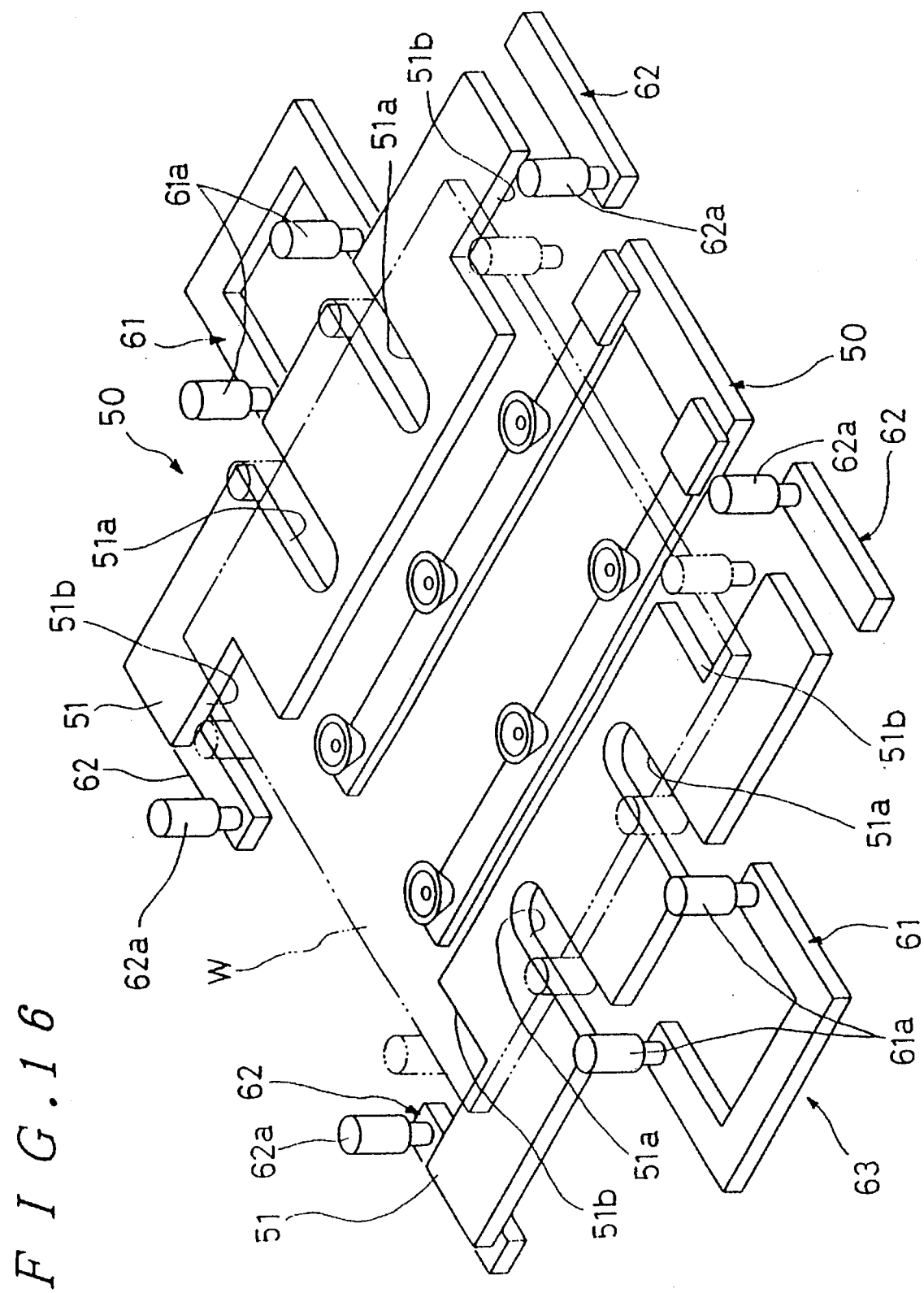
FIG. 16 is a perspective view showing an arrangement of the reverse stage according to the present invention.
Figure 17:
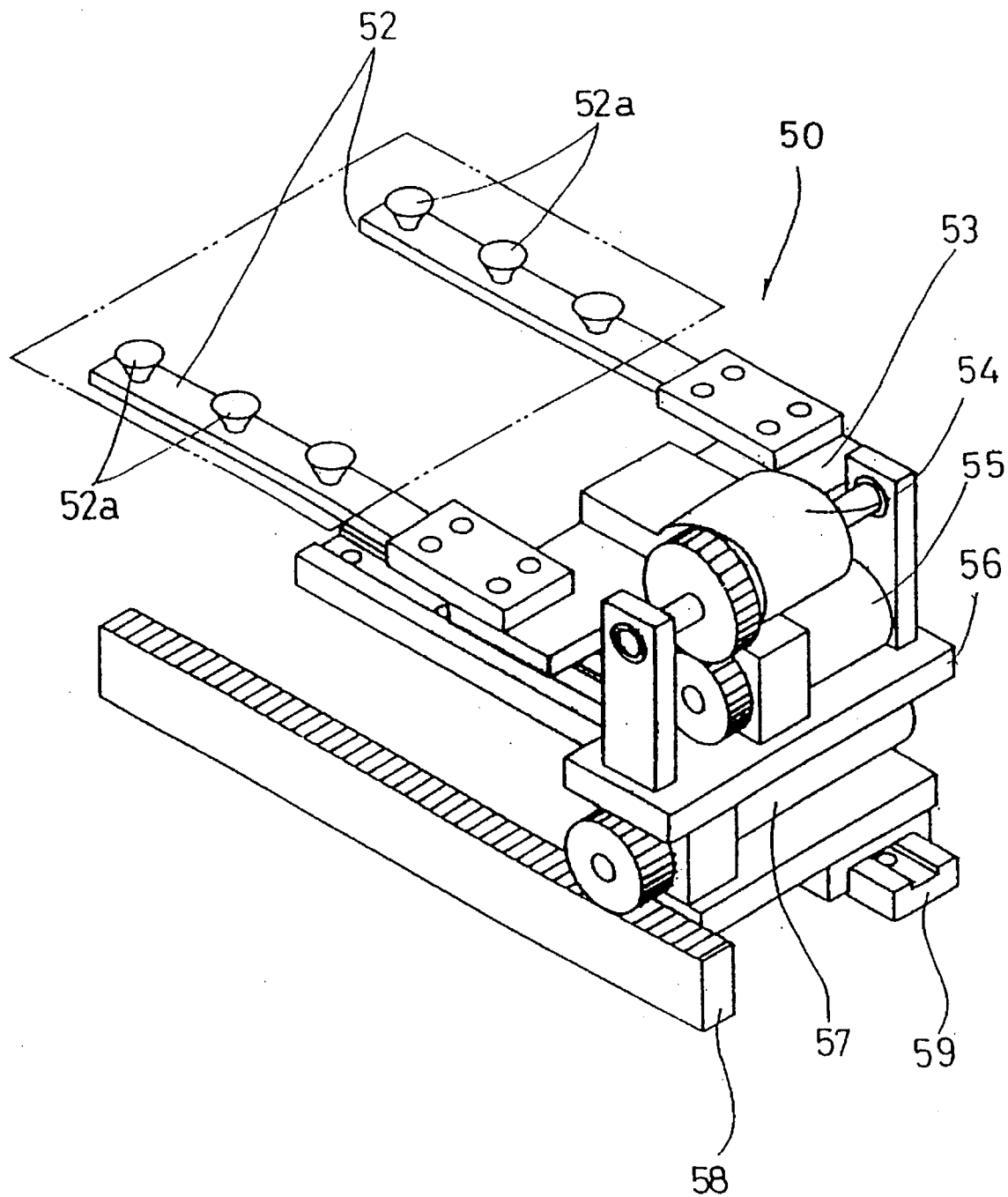
FIG. 17 is a perspective view showing the structure of the reverse device according to the present invention.

As shown in FIG. 16 and FIG. 17, the reverse device 50 comprises a support arm 52 having suction pads 52a to hold the work, a rotatable support section 54 to rotatively support the base of the support arm 52 by a fitting plate 53, a driving motor 55 to drive the rotatable support section 54, a support table 56 to place said rotatable support section 54 and the drive motor 55, a rack 58 as a delivery means to transfer the support table 56, a pinion and its drive motor 57 and a guide 59.

Also, as shown in FIG. 16, there are provided the lifting tables 51, 51 at both sides of said reverse device 50. The lifting table 51 comprises a table 51d (refer to FIG. 18) for the work W and a driving device 51c to lift up and down the table 51d. The table 51d is provided with grooves 51a, 51b so that the prealignment mechanism 63 may proceed preliminary locating of the work W. Number of the grooves 51a, 51b corresponds to the number of protrusions 61a, 62a of pushing devices 61, 62 of the pre-alignment mechanism 63. Configuration or pattern of the table 51d is not restricted if the table can support the work.

Figure 19:
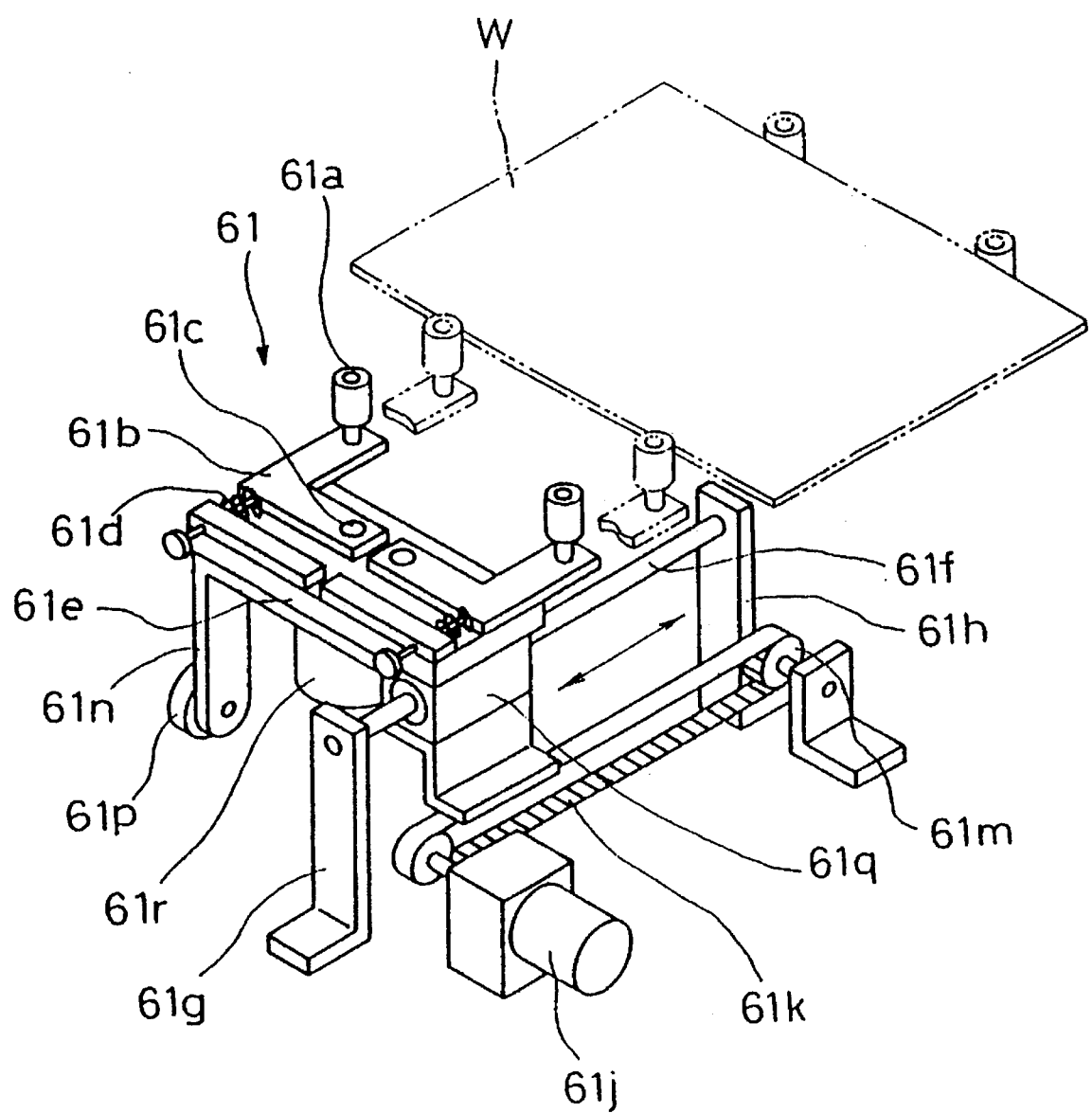
FIG. 19 is a perspective view showing a press device of the prealignment mechanism according to the present invention.
Figure 20:
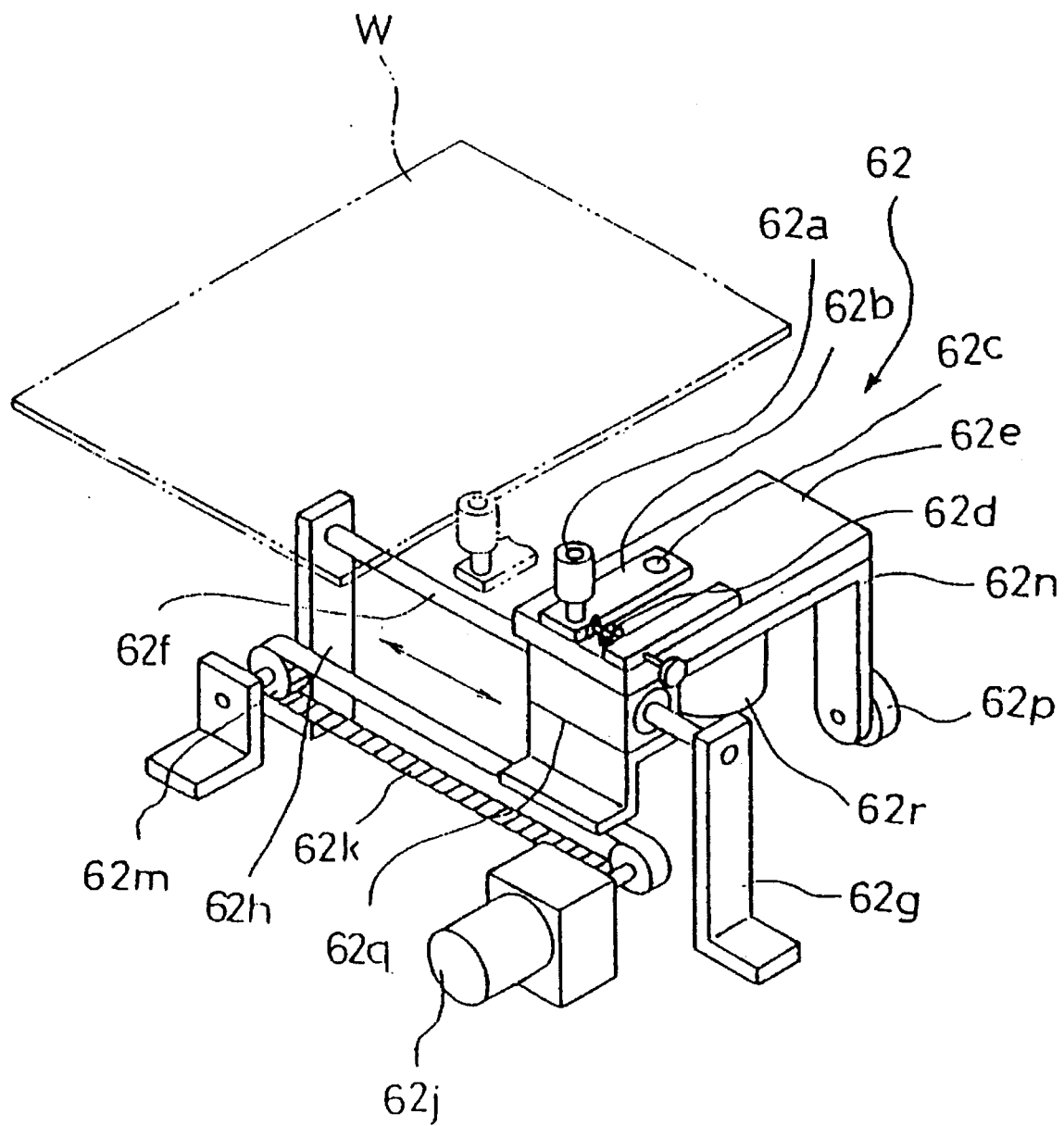
FIG. 20 is another perspective view showing the press device of the prealignment mechanism according to the present invention.

As shown in FIG. 16, FIG. 19 and FIG. 20, the prealignment mechanism is provided with push devices 61, 62 to push the work W from the four sides toward the center thereof. The push device 61, as shown in FIG. 19, comprises work pushing sections and a delivery mechanism to move the pushing sections. The work pushing section comprises push protrusions 61a provided symmetrically left and right on a base table 61e to push the work a support plate 61b to support the push protrusion 61a, a support pin 61c to support the support plate 61b rotatively and a spring 61d provided at rearward of the support plate 61b.

The delivery mechanism is provided with a frame 61n to support the base table 61e, a wheel section 61p provided at one leg frame of the frame 61n and a drive connecting part 61q. The drive connecting part 61q is provided with a guide bar 61f retained rotatively. The guide bar 61 is supported by the support section 61g, 61h vertically provided at both ends of said guide bar 61. The other end of the leg frame of the frame 61n is connected to a timing belt 61k. The timing belt 61k is suspended between a pulley provided with a drive motor 61j and the other pulley 61m.

Accordingly, when the drive motor 61j is started to drive the timing belt 61k, the pushing section moves toward the work W. When the timing belt 61k is reversed according to the reverse drive of the drive motor 61j, the pushing section moves adversely to come apart from the work W.

The support plate 61b to support the push protrusion 61a is mounted rotatively and at rearward side of the support plate 61b a spring is provided. The spring is forced in the direction of extension. When the push protrusion 61a pushes the work, it is nothing to worry about the work W being distorted by unnecessary force even the thickness of the work is thin.

Reference nuemeral 61r in FIG. 19 indicates a cylinder unit to lift up and down the base 61e when protrusion level of the push protrusion 61a is not required except for the prealignment.

The structure of the push device 62 is the same as the structure of the push device 61 as shown in FIG. 20, except for the structure that the support plate 62b of the base 62e, spring 62d and the push protrusion 62 a form one set, respectively. Each reference alphabetical expression of the push device 61 corresponds to each reference alphabetical expression of the push device 62.

The aforementioned prealignment mechanism 63 is the same one as provided at the feed-in stage A. The push devices 3a, 3b, 3c, 3d of the prealignment mechanism 3 of the feed-in stage A are the same structure of the push devices 61, 61, 62, 62. The two sets of the push devices 61, 3a facing each other jointly hold one drive source. It is also possible to contact the timing belt with one end of the frame.

Starting and ending of operation at each stage and starting and ending of transfer and locating the work are performed by various sensors (not shown). The control section to control each operation is performed by previously inputted program and processing data introduced by the key board shown in FIG. 2.

The order of process to expose the upper surface and the under surface of the work by an exposing apparatus according to the present invention is as follows:

At first, as shown in FIG. 1 and FIG. 2, flow of the work W and operating location thereof are explained. The work W, after preliminary locating is finished at feed-in stage A, is transferred to the first alignment stage B by the handler 15 (refer to arrow a). During the alignment operation for the work at the first alignment stage B, a new work coming into the feed-in stage A is located therein.

The first work completed its alignment is transferred to the exposing stage C (refere to arrow b). The next work located in the feed-in stage is transferred to the first alignment stage B by the handler 15 (refer to arrow a') for alignment operation.

The work W is located in the feed-in stage to be predetermined its location. The work exposed in the exposing stage B is transferred to the prealignment stage B by the delivery table 26. Concurrently, the already aligned work locating in the first alignment stage 13 is transferred to the exposing stage C (refer to arrow b').

The exposed work W returned to the first alignment stage B is transferred to the reverse stage D (refer to arrow d). Next work is transferred to the first alignment stage B by the handler 15 for alignment operation. At this time the exposed work W is placed on the delivery table 26 in the first exposing stage C.

On the other hand, the work W transferred to the reverse stage is reversed from upper surface to under surface (refer to arrow e) and preliminarily located. After preliminarily located, the work is transferred to the second alignment stage E by the handler 65 (refer to arrow f). There is provided a next work W in the feed-in stage A.

The already exposed work W is transferred to the first alignment stage B (refer to arrow c') and the already aligned work W is transferred to the first exposing stage C. Further, the work W in the first alignment stage B is transferred to the reverse stage D by the handler 25 (refer to arrow d'). Concurrently, a new work W in the feed-in stage is transferred to the first alignment stage B by the handler 15.

After alignment operation has been done, the work W is transferred to the second exposing stage (refer to arrow g). The work W is reversed from the upper surface to the under surface (refer to arrow e') for preliminary locating. After preliminarily located, the work is transferred to the second alignment stage E by the handler 65 (refer to arrow f'). At this time new work is located in the feed-in stage A.

After exposing operation has been done, the work W is transferred to the first alignment stage B by the delivery table 26. Concurrently, the already aligned work W is transferred to the first exposing stage C.

After the exposed work W is transferred to the second alignment stage E (refer to arrow h) and the already aligned work is transferred to the second exposure stage E (refer to arrow g'). The work locating in the first alignment stage is transferred to the reverse stage D by the handler and a new work locating in the feed-in stage A is transferred to the first alignment stage by the handler 15.

The work W locating in the second alignment stage is transferred to the discharge stage G by the handler 75 (refer to arrow i) and the work W in the reverse stage is transferred to the second alignment stage E. At this time a new work W is provided in the feed-in stage A.

As aforementioned, locating, transfer and exposing operations of the work W have been proceeded. The work is exposed its upper surface and under surface in continuous operation. If the operation of each stage is not properly or smoothly done an warning lamp indicated by reference numeral 89 in FIG. 3 and FIG. 4 informs such troubling by turning switch on and off or issuing an alarm signal. Each operation for the work W in each stage is proceeded continuously and smoothly as such mentioned, thus productivity is greatly improved.

Next, operation of each device in each stage is explained.

As shown in FIG. 2, the work W in feed-in stage A is located in the predetermined position by rotation of the table 2 by means of the drive motor. When the work W is reached the predetermined location, the push devices 3c, 3d, 3a, 3b of the prealignment mechanism 3 located between the each of the rollers in the feed-in stage A push the work W from four sides toward the center of the work. The work is thus prelocated. After prelocating operation of the work is over, the push protrusions of each push device descend by means of drive of a cylinder 61r. (Refer to FIG. 19 and FIG. 20.)

After prelocating of the work is finished, the handler 15 descends to absorb the work with the absorb part 15a and is moved up to transfer the work W to the prealignment stage B. Then the handier 15 descends and the work W is placed on to the one lower printing frame 24 on the alignment table 10.

The work placed on the lower printing frame 24 is vacuum sucked to be retained by the lower printing frame. The locating mark (the through holes, but not shown) of the work W is optically recognized by the camera 22 as shown in FIG. 5. Light issue tables 6, 6 located on the alignment table 10 issue an yellow light to facilitate recognizing locating marks of the work W more accurately and easily. (Refer to FIG. 6.) As shown in FIG. 5 the locating mark of the work optically recognized by the camera 22 is confirmed by the control part 86.

When no positional deviation amount is found, the upper printing frame 23 placed in the exposing stage C is transferred to the alignment table 10 by means of delivery mechanism 28. When the upper printing frame 23 comes on to the alignment table 10, the Z section of the alignment table 10 pushes the lower printing frame 24 upward as shown by the imagination line in FIG. 5 to contact the upper printing frame 23 with the work W and release the vacuum suction on the under surface of the lower printing frame 24. Then, the upper printing frame 23 absorbs the lower printing frame 24 and the work by its vacuum suction. (Refer to FIG. 9.)

The camera 22 again confirms if the work is correctly located or not retaining the work securely by the upper and the lower printing frames. If no positional deviation amount is found and the work is properly located, the work W is transferred to the exposing stage C together with the lower printing frame 24 by means of the transferring mechanism 28 of the upper printing frame 23.

In case a positional deviation amount is found after the upper and the lower printing frames 23, 24 have retained the work W, the Z section is moved up to retain the lower printing frame 24 (along with the work). The vacuum suction of the upper printing frame 23 is released. The Z section of the alignment table 10 is descended. The upper printing frame 23 is transferred to the exposing stage C and alignment operation is again proceeded by means of camera 22.

On the other hand, as shown in FIG. 5, the delivery table 26 locating in the exposing stage holds the other lower printing frame 24 on the table 26. The other lower printing frame 24 is transferred to the alignment table 10 in the first alignment stage B by the delivery mechanism 2 7. The delivery table 26 is again transferred to the exposing stage C by means of the transferring mechanism 27.

When the lower printing frame is transferred to the alignment table 10 from the delivery table 26. The work placement level on the alignment table 10 is lower than that of the under surface of the work placed on the delivery table 26. After the work W placed on the delivery table 10 is transferred to just upper portion of the alignment table 10, the alignment table 10 raises the Z section to keep the work and the lower printing frame 24 by means of the retaining means 9 of the X table. During slightly ascending the alignment table 10, the delivery table 26 is again transferred to the exposing stage C. As the delivery table is transferred, the alignment table 10 lowers the Z section and wait for coming of the next work W.

Next, when the work is transferred to the exposing stage C from the alignment stage B. The ultraviolet rays is irradiated from the light source 33 of the ultraviolet rays irradiation stage If. As shown in FIG. 4 and FIG. 15, the ultraviolet rays is lead to the large reflector 20a through the reflector 34, the flyeye lens 35 and the change-over mirror 36. Further, the light is vertically falls from the large reflector 20a down to the work W held by the upper and lower printing frames to expose the work W. Accordingly, the direction irradiated from the light source advances straightly up to the change-over mirror 36 and from the change-over mirror 36 it advances with angle. Thus the space required from the light source 33 to the work W is housed in a nallow scope.

As shown in FIG. 5, after one surface of the work W is exposed, the table 21a of the lift support table 21 located in the exposing stage C is moved up by means of the cylinder 21b to contact the under surface of the lower printing frame 24. When vacuum suction of the upper printing frame is released, the work W is transferred to the table 26a on the delivery table 26 by means of the table 21a descending by means of the cylinder 21b. The work is kept as being vacuum sucked under the lower printing frame 24. (Refer to FIG. 9–FIG. 10.) Further, the delivery table 26 placing the lower printing frame 24 thereon again moves to the alignment stage B by means of the transferring mechanism 27. The lower printing frame 24 holding the work W transferred by means of the table 26 is always transferred to the predetermined location on the X table 11 of the alignment table 10 by means of the transferring mechanism 27.

The lower printing frame 24 comes on to the X table is held by the support means 9 of the X table. The work W vacuum sucked by the lower printing frame 24 is displaced from the transparent plate 24a of the lower printing frame 24 (see FIG. 11) by exhausting the air from the connecting portion 9a just corresponded to the connection part 45 of the lower printing frame 24. After that the work W is transferred to the reverse stage by the handler 25. The work is transferred without positional deviation amount in each stage.

Figure 18A:
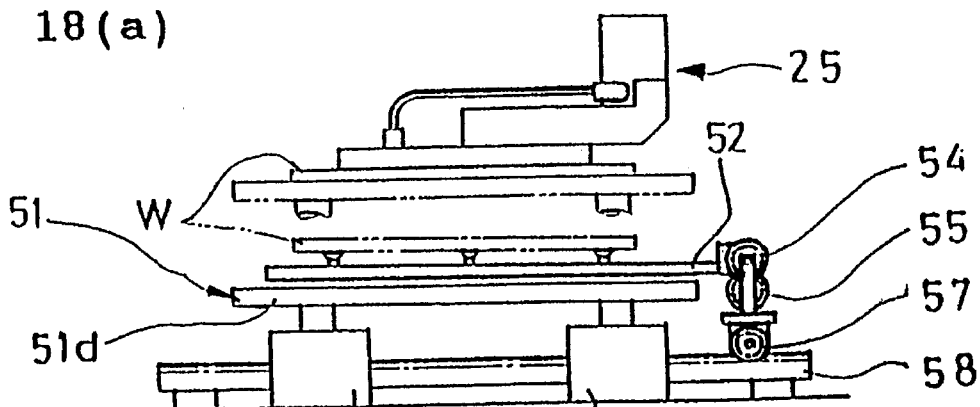
FIG. 18 (a), (b) and (c) are side views showing reversing action of the reverse stage according to the present invention.
Figure 18B:
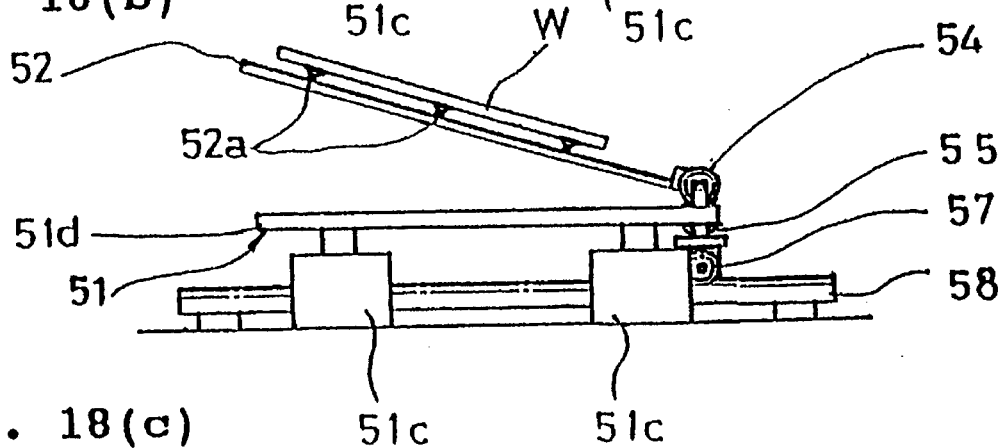
Figure 18C:
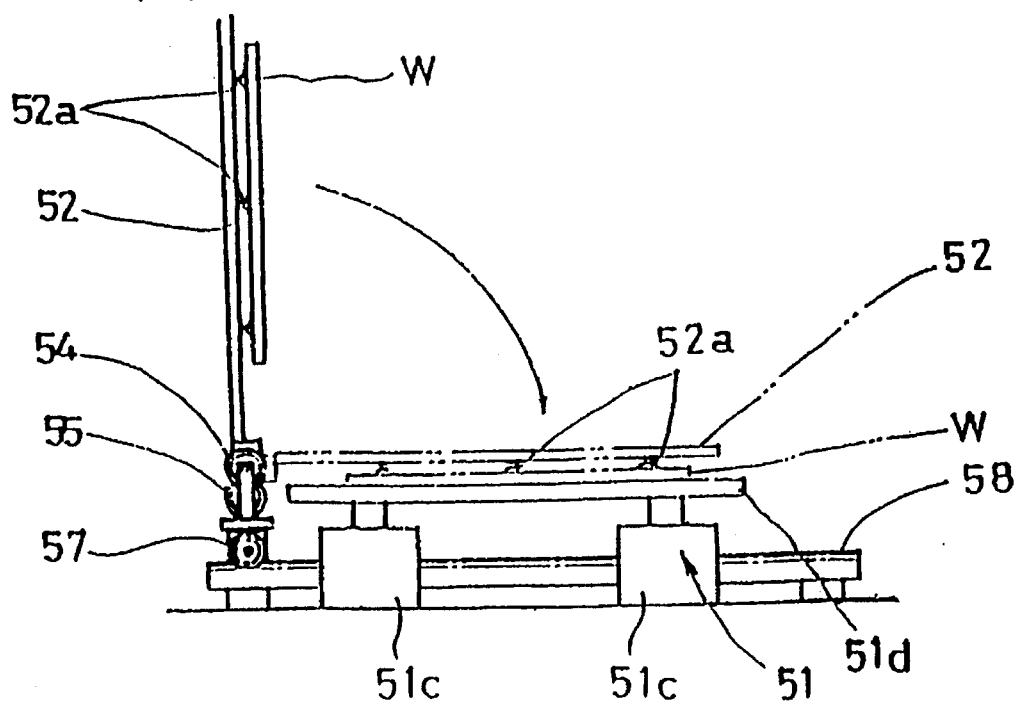

As shown in FIG. 18 (a), (b), (c), the work W came to the reverse stage D is transferred by the handler 25 onto the table 51d of the lift table 51 which is coming up. Then the lift table 51 is descended as keeping the work W on the table 51d to transfer the work W to the suction pad 52a of the support arm 52 of the reverse device 50. The work W is sucked by the suction pad 52a. (Refer to FIG. 18(a))

The support arm 52 is held uprightly holding the work by rotating the rotatable support section 54 by rotation of the drive motor 55. The pinion 57 is rotated by the drive motor 57 along the guide 59 and the rack 58. The apparatus is delivered from one end of the rack 58 to the other end. (Refer to FIG. 18(b)–18 (c).)

The drive motor 54 is continuously driven at the delivered end to rotate the support arm to hold the work W to the direction indicated by arrow. The work W is reversed and it is placed on the table 51d of the lift table 51 and vacuum suction of the suction pads 52a of the support arm is released. (Refer to an imaginary line in FIG. 18 (c).) The work is reversed from the upper surface to the under surface.

The reverse device 50 is operated as uprightly supporting the support arm and the work as shown in FIG. 18 (c). The preliminary locating of the work W is carried out by means of the prealignment mechanism 63. As shown in FIG. 16, the prealignment operation is done as shown in FIG. 16, namely, each of the push devices 61 and 62 is delivered from right to imaginary line and the work is pushed from four sides toward the center. The timing belt 61 is rotated by rotation of the drive motors 61j and 62j of the push devices 61 and 62, respectively as shown in FIG. 19 and FIG. 20. The push devices 61 and 62 are moved toward the work W.

The work W, after completion of preliminary locating, is sucked to the suction part 65a of the handler 65. The lift table 51 ascends and the handler 65 descends for this operation purpose. The handler 65 ascends and the work W is transferred to the second alignment stage E. The same alignment operation and exposing operation as that of the operation in the first alignment stage B and the first exposing stage C are repeated to expose the under surface of the work W and the work is then discharged from the discharge stage G from the second alignment stage B by the handler 75. The upper surface and the under surface of the work are thus exposed and a series of continuos exposing operation is completed.

Figure 22:
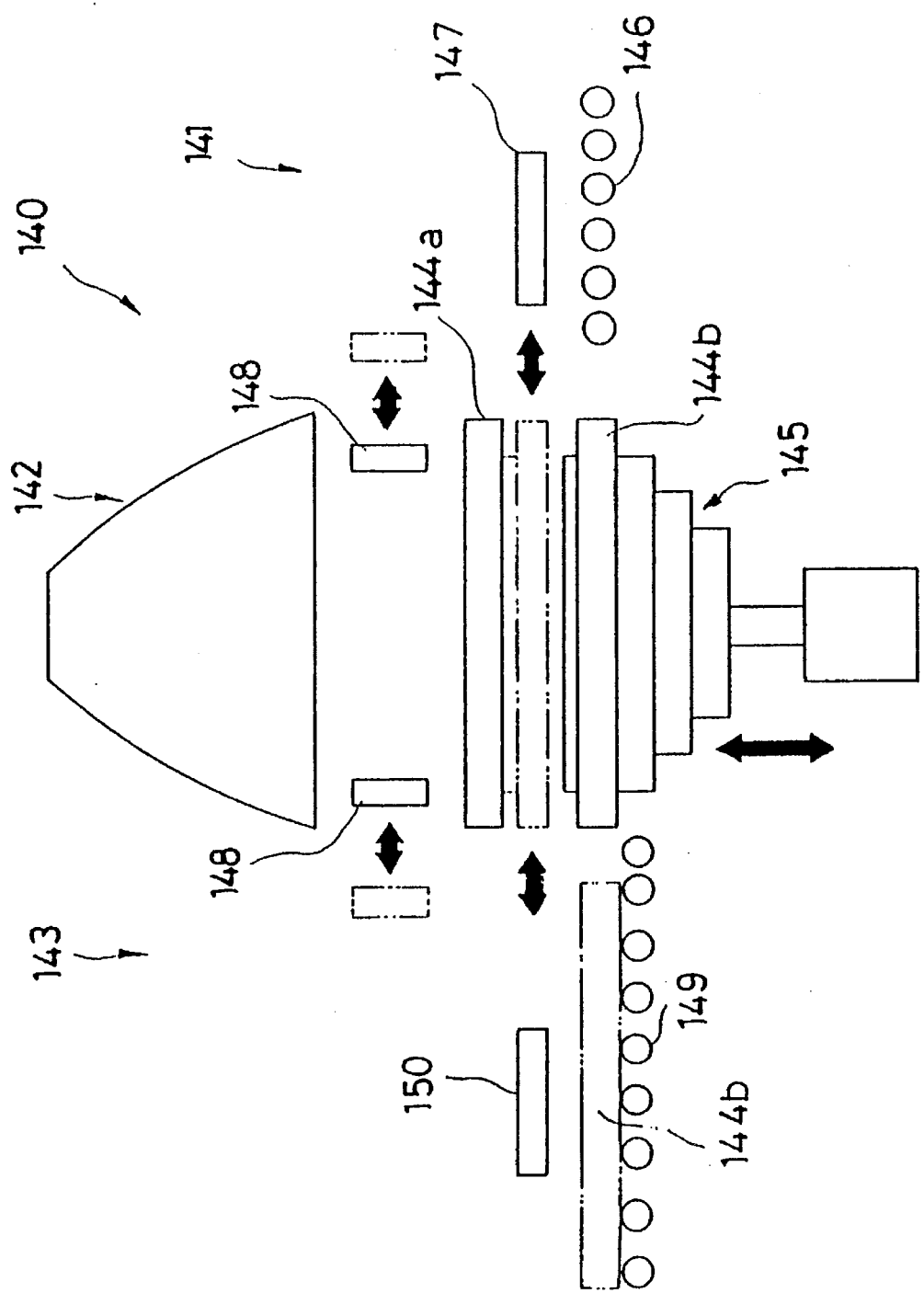
FIG. 22 is a principle explanation view showing an applied example of the upper and lower printing frames according to the present invention.

The present invention is not limited only to the scope as aforementiond embodiments. For instance, if two sets of the lower printing frames and one upper printing frame are applied, an exposure apparatus in which exposing stage and alignment stage are the same. As shown in FIG. 22 the exposing apparatus 140 comprises the feed-in stage 141, the exposing and alignment stage 142 and the discharge stage 143. The upper printing frame 144a and the lower printing frame 144b of the vacuum frame are provided separately. The vacuum frame comprises assembled upper printing frame 144a and lower printing frame 144b caused by lifting motion of the alignment table 145. One lower printing frame 144b is placed on the alignment table 145 and the other lower printing frame 144b is provided in the discharge stage.

Accordingly, the work W which came to the feed-in stage by means of the delivery rollers 146 is sucked by the handler 147 to place the work on the lower printing frame 144b. After confirming the locating mark by the cameras 148 the work is located properly. When the upper printing frame 144a and the lower printing frame 144b are assembled by lifting motion of the alignment table 145 the locating position is again confirmed. If positional deviation amount is not found and the work is confirmed to be properly located, exposing operation is carried out.

On the other hand, it is possible to place another lower printing frame 144b provided in the feed-in stage on the alignment table 145. The delivery means 149 (this delivery means is shown by the delivery rollers 149) transfers the lower printing frame 144b from the feed-in position. A coming work is placed on the lower printing frame 144b by the handler 147.

The upper printing frame 144a is transferred to the feed-in side by a transferring means (not shown in the figure) to place the work W on the delivery rollers 149 by means of a lifting means (not shown in the figure). The work is treated as being held by the lower printing frame 144b. The work is sucked by the handler 150 coming from the discharge stage and is transferred to the discharge stage. (In case the upper printing frame is not transferred, the work and the lower printing frame are treated by another transferring means such as handler or the like.) Accordingly, construction of one upper printing frame and two lower printing frames improves exposing efficiency of the apparatus.

Plane reflectors, parabolic reflectors, suspected spherical mirrors or suspected parabolic reflectors are also applied in place of the large reflectors according to exposing accuracy required by the work W. There are also provided some open and close doors in the exposing stage C and F and the light source 33 is easily moved to the exposing stages C and F by means of slide rails or other transferring mechanism. This movable light source fits nallow space of the exposing apparatus.

It is required that the ball valve dose not close the opening hole 45 c when air is fed and suction operation is performed in the lower printing frame. It is also allowed to provide a protrusion in the vicinity of the opening hole 45c and the protrusion dose not close the opening hole.

Figure 23:
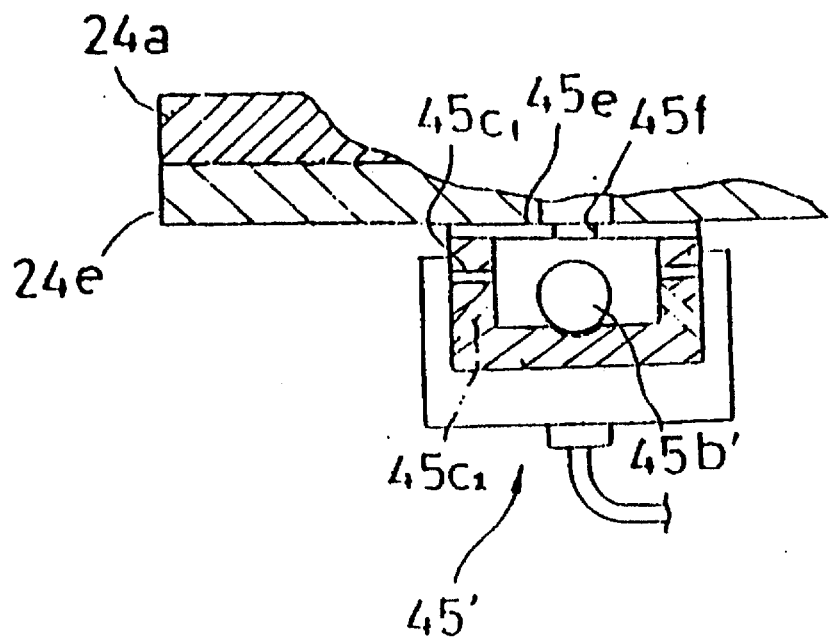
FIG. 23 is a part of cross-sectional view showing an applied example of the connecting part of the lower printing frame according to the present invention.

As shown in FIG. 23, the structure of the connecting part 45' is such that the mounting plate 45e provided with the opening 45f is provided on the mounting frame 45' at the side where the connecting part contacts to the transparent plate of the lower printing frame and another opening $45_{c1}$ is provided along the side surface. Another opening $45_{c2}$ is also sightly provided as shown by imaginary line in FIG. 23. The structure of each connecting part is of a cross-section of ] configuration and it is provided with an opening at the opening $45_{c1}$ to intake and exhaust the air.

Figure 24:
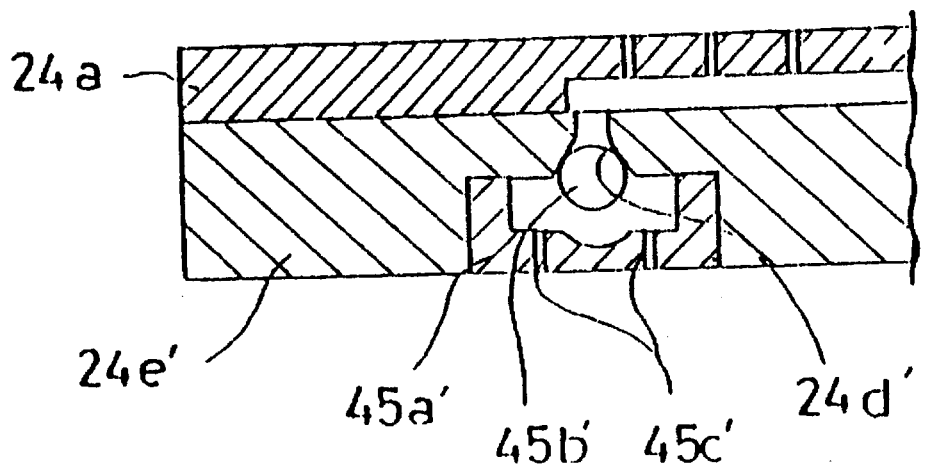
FIG. 24 is a part of cross-sectional view showing another applied example of the connecting part of the lower printing frame according to the present invention.

Further, as shown in FIG. 24, the connecting portion is buried in the transparent plate 24e' of the lower printing frame. The connecting part comprises the ball valve 45b' connecting part body 45a', a plural number of 45c' and an opening including an inclined plane 24d'.

Figure 21:
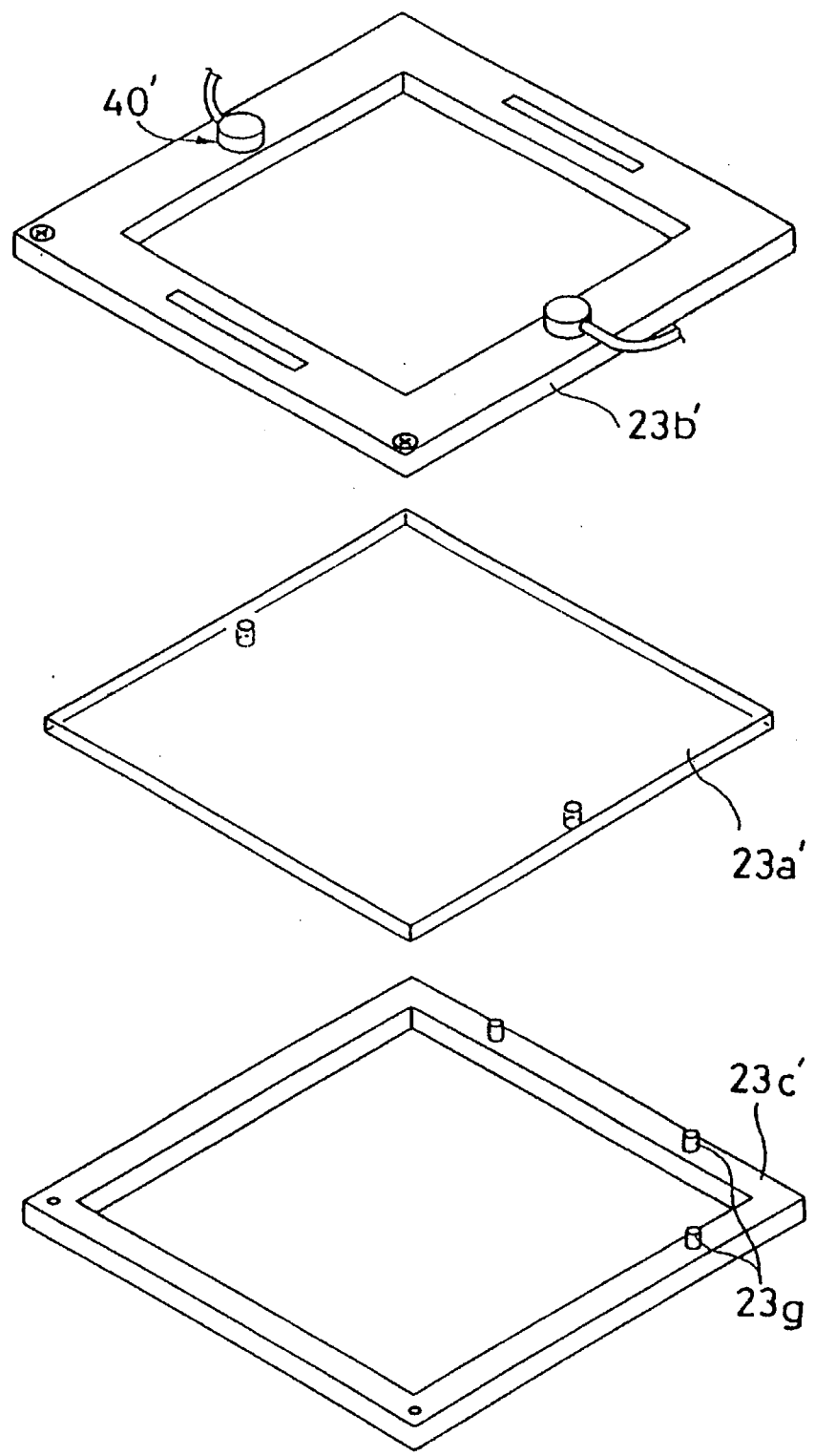
FIG. 21 is an analytic perspective view showing an applied example of the upper printing frame according to the present invention.

Also, as shown in FIG. 21, it is also allowed that the upper printing frame comprises upper frame 23b', transparent plate 23a', and lower printing frame 23c'. The upper printing frame 23b' is provided with connecting pads 40, 40 for vacuum-suction, said connecting pads being provided to pass through the upper printing frame 23b'. There is provided a fitting pin 23g on the lower printing frame 23c' to fit with the upper printing frame 23b'. There are provided pin fitting holes at the under surface of the upper printing frame which correspond to the pin protrusion to hold integrally the transparent plate 23a' between the upper printing frame 23b' and the lower printing frame 23c'.

Accordingly, it is easy to displace the transparent plate by moving up the upper printing frame. This structure offers an optimum condition to replace the transparent plate.

The lifting table in the exposing stage comprises the lifting table held between the delivery table and the support table. The lifting table may apply a pattern of ] configuration which will not disturb the delivery table when it is transferred to the alignment table.

Figure 25A:
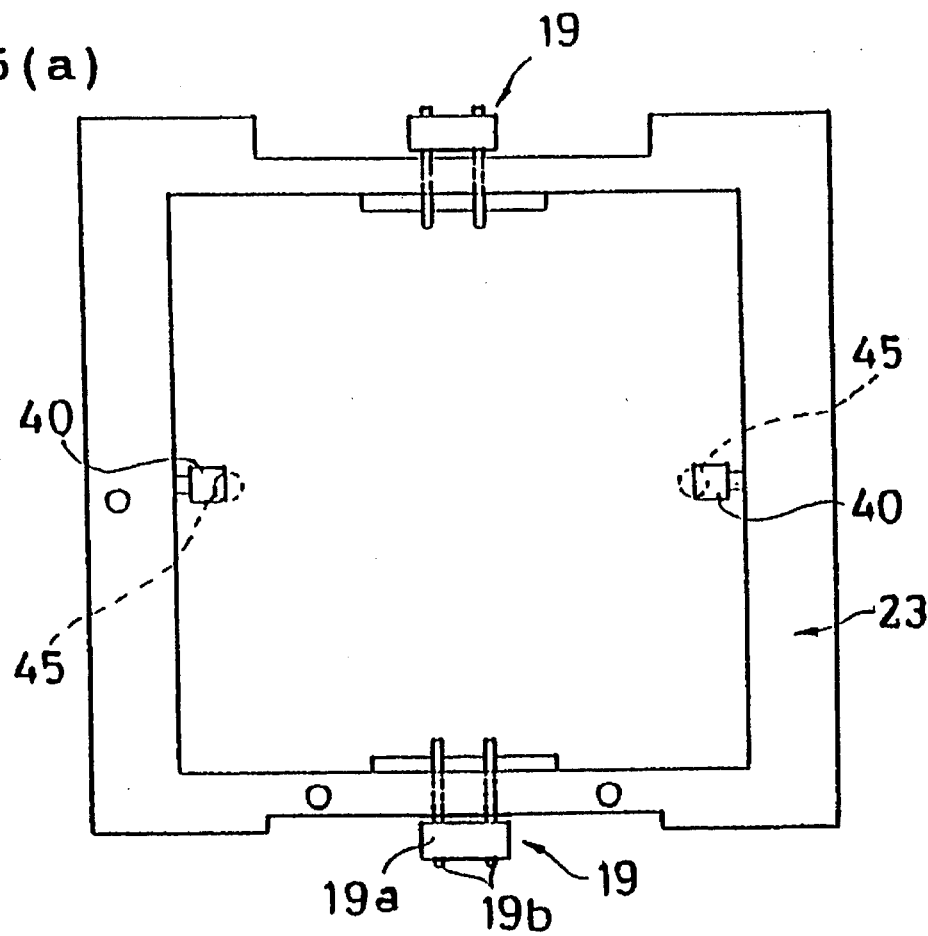
FIG. 25 (a) is a plan view showing connecting state of the upper and lower printing frames according to the present invention.
Figure 25B:
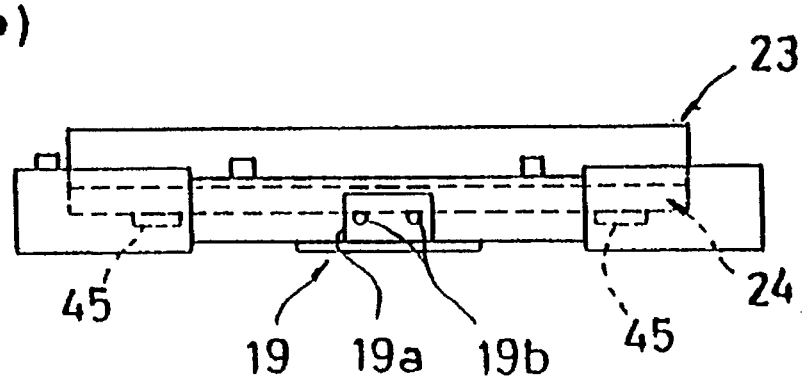
Figure 26:
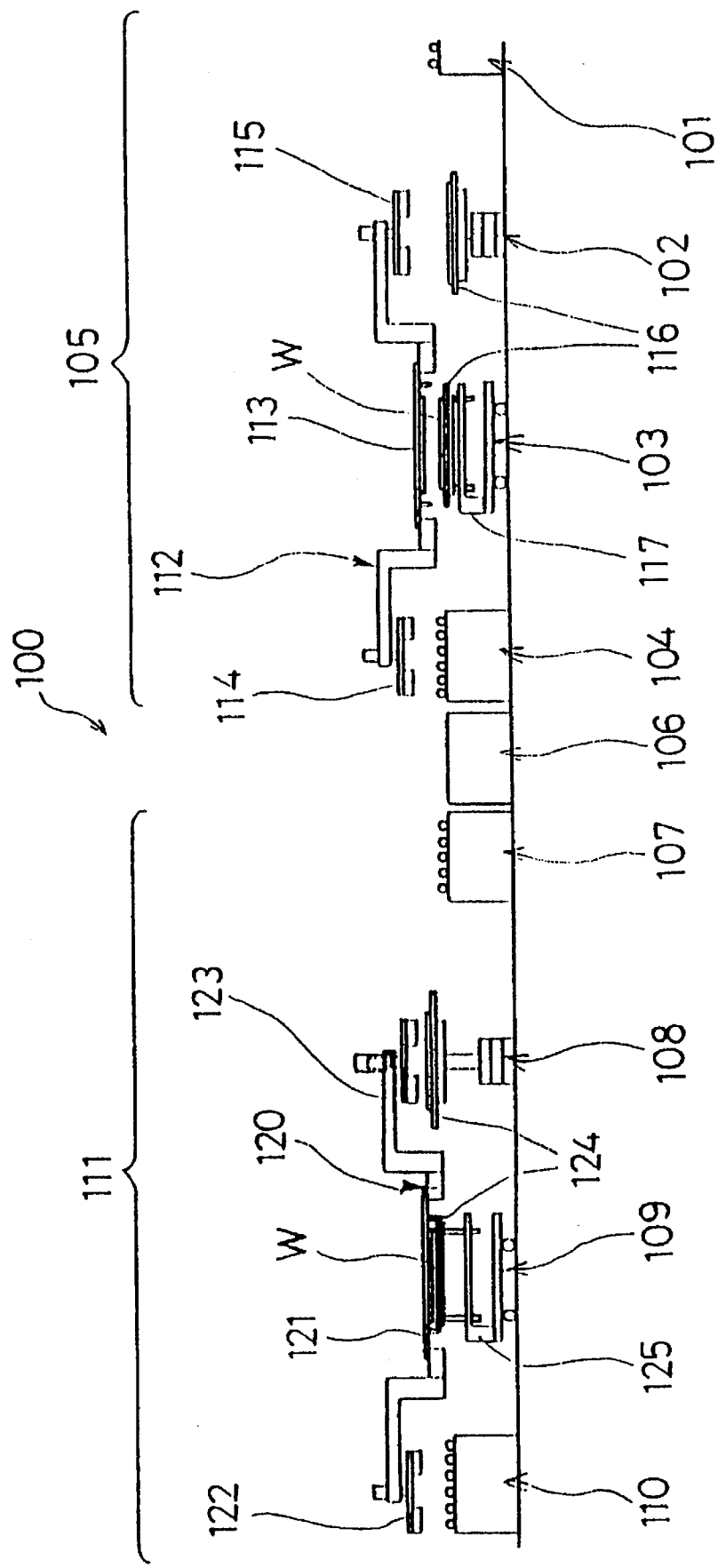
FIG. 26 is a principle explanation view showing the exposing apparatus according to the prior art.
Figure 27:
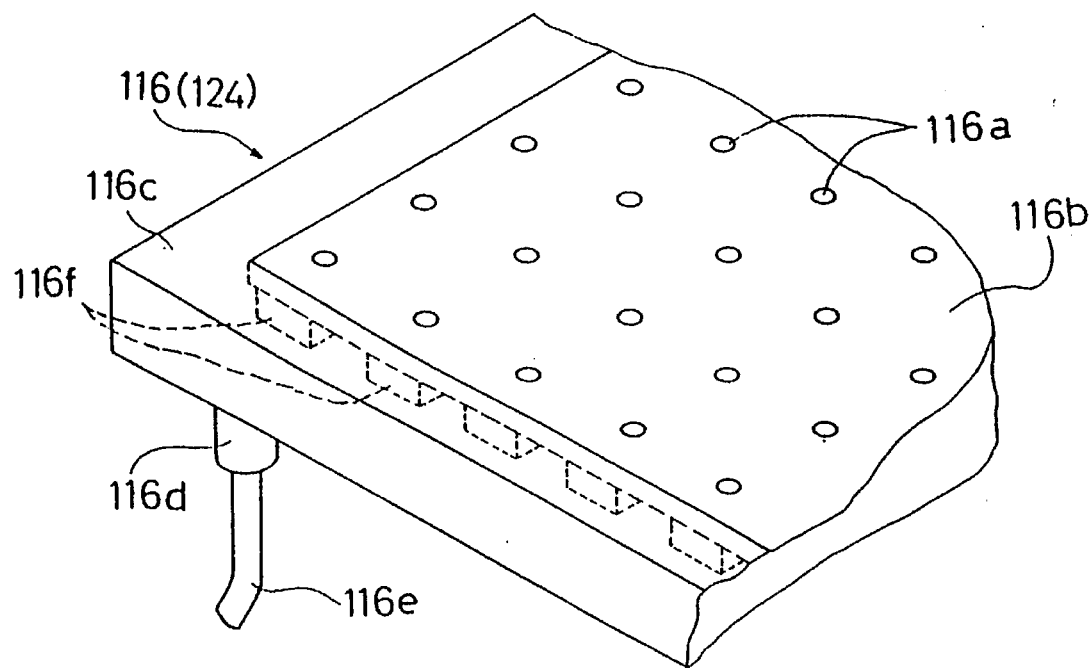
FIG. 27 is a perspective view showing a part of the lower printing frame according to the prior art.
Figure 28:
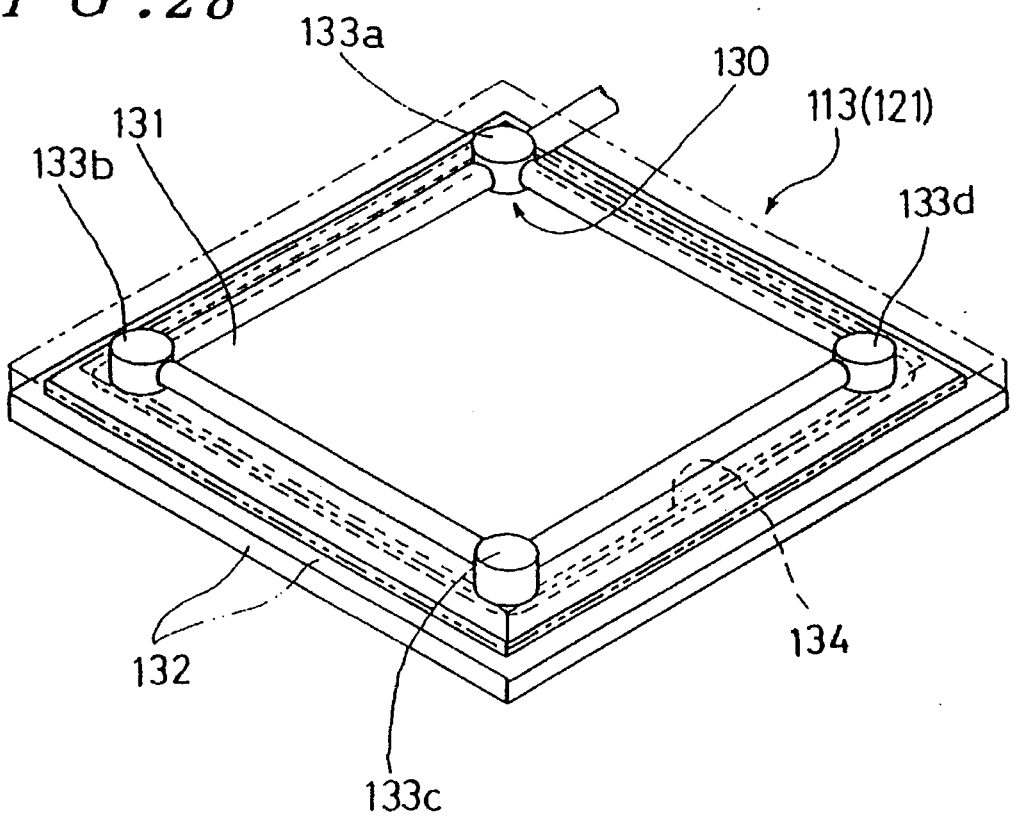
FIG. 28 is a perspective view showing the upper printing frame according to the prior art.

As shown in FIG. 25(a) (b), when the upper printing frame absorbs the work and the lower printing frame after completion or alignment operation to transfer to the exposing stage, the work and the lower printing frame are held by the suction means of the upper printing frame 23. In case unexpected troubles such as stoppage of electricity, or the like, should occur, the work and the lower printing frame are displaced due to release of vacuum suction. For this reason, there are provided supplemental retaining means 19, 19 on the upper printing frame 23. The supplemental retaining means 19 comprises the retaining body provided at the upper printing frame 23 and the support part 19b which is horizontally provided on the body 19a. When the lower printing frame 24 is vacuum-sucked by the vacuum suction means such as connecting pads 40 of the upper printing frame 23, the support section 19b, 19b of the supplemental support means 19, 19 are protruded to the ceter direction to support the under surface of the lower printing frame 24. Accordingly, even if the suction means of the upper printing frame 23 is stopped, the lower printing frame 24 and the work W do not fall down. After the lower printing frame and the work are properly transferred by the upper printing frame 23 and exposing operation is over, the support part 19b of the supplemental retaining means 19 is withdrawn and then the upper printing frame and the lower printing frame are separated.

A plural number of said supplemental retaining means may be applied. In this case, the structure of the lower printing frame does not require the ball valves at its connecting part. It is of course possible to modify or improve the invention within the scope of the subject matter of the invention.

ADVANTAGES OF THE PRESENT INVENTION

The following advantages are obtained according to the present invention.

(1) The space of the clean room to proceed the exposing operation by the present invention is 40 per cent decreased in comparison with prior art.

(2) Only one light source can expose upper and under surfaces of the work. Thus, the exposing apparatus does not become large.

(3) The upper printing frame to hold the work comprises the transparent plate whose frame is provided with suction hose and suction pads. When the transparent frame is deteriorated by repeated exposing operation, the transparent plate is easily replaced.

(4) The lower printing frame to transfer the work by suction securely hold the work with the transparent plate of the lower printing frame but it is forcedly displaced. Thus, operation efficiency is improved.

(5) The operation is carried out with the upper printing frame and the two lower printing frames as the upper and the lower frames being repeatedly assembled and displaced. However, the connecting parts of the lower printing frame correspond to the connecting parts located in each operating stage make the operation of the air pump such as suction and blowing out smoothly. Thus, no positional deviation in locating the work is observed on the lower printing frame.

(6) The reverse stage is provided with the prealignment mechanism and the work reversing device to perform the operation in small operating space.

(7) The reverse device in the reverse stage is carried out in such a manner that the work is retained by the support arm by suction and the work is transferred with the rotatable support section as said rotatable support section being rotated to the opposite end to reverse the upper surface to the under surface. Thus, operating space is small.

(8) As there are provided the plane reflector, the flyeye lens and the change-over mirror are provided in the ultravioloet rays irradiation stage, the ray advances to three ways properly. The distances between the light source and the reflector, the flyeye lens and the change-over mirror are short and this is benefit to make the appratus smaller and operation time shorter.

(9) The lower end of the suction pads is located inside the contacting surface of the handler. The work is not distorted even if the thickness of the work is thin.

(10) The work is processed as a part of the vacuum frame, namely, the work is held between the upper printing frame and the lower printing frame during the locating confirmation operation and the exposing operation. Then the work is transferred as it is placed on the lower printing frame. Thus, operations of locating the work and exposing the work are proceeded accurately and smoothly. Further, the vacuum frame comprising two lower printing frames and one upper printing frame is transferred repeatedly in sequential order between the exposing location and the alignment location. The operation efficiency is improved in spite of the location of the exposing stage and the alignment stage.

(11) The alignment table can hold or displace the the lower printing frame and it is provided with a connecting part which corresponds to the connecting part communicated from the work contacting surface of the lower printing frame. Thus the work is easily displaced from the lower printing frame supporting the already aligned and exposed work thereon.

What is claimed is:

1. An exposing apparatus comprising an alignment table to transfer a work which is held on a lower printing frame to a predetermined position to locate said work, a first alignment stage providing a first camera to confirm a predetermined locating position, a first exposing stage to expose the located work, a reverse stage to reverse the exposed work from upper surface to under surface, an alignment table to transfer the work placed on the lower printing frame to a predetermined position, said work being already reversed from upper surface to under surface in the reverse stage, a second alignment stage providing a second camera to confirm if said work has been properly located, and a second exposing stage to expose the already located work in the second alignment stage, wherein said first alignment stage, said reverse stage and said second alignment stage are arranged in a straight line direction, and wherein each of said first and second alignment stages are provided with the first exposing stage and the second exposing stage, respectively, in perpendicular direction to the straight line direction, and an ultraviolet rays irradiation stage is provided between said first exposing stage and the second exposing stage, said exposing apparatus being provided with a plural number of handlers to transfer the work along the straight line direction from the first alignment stage to the second alignment stage, an upper printing frame and a lower printing frame of the exposing apparatus form a vacuum frame to perform locating, transfer and exposing of the work and holding said work between the upper printing frame and the lower printing frame, said locating, transfer and exposing of the work being operated between the alignment stage and the exposing stage by means of transferring means to transfer the work with the upper printing frame and the lower printing frame.

2. An exposing apparatus according to claim 1, wherein the vacuum frame comprises:

an assembly of one upper printing frame and two lower printing frames, each of the two lower printing frames being combined with the upper printing frame, alternatively, said upper and lower printing frames being provided with suction means, respectively, during locating confirmation operation of the work and exposing operation of said work the upper and the lower printing frames are assembled by means of vacuum suction means of either frame to form the vacuum frame, locating of the work and transfer of the exposed work are proceeded on the lower printing frame, said lower printing frame being separated from the upper printing frame.

3. An exposing apparatus according to claim 1, wherein the vacuum frame further comprises:

one upper printing frame and two lower printing frames, the upper printing frame and the lower printing frames are displaceable each other, said lower printing frames being located in the alignment stage and next processing position, respectively, said lower printing frame located in the alignment stage is lifted after alignment operation is over and transferred to the next processing position by the transferring means, said lower printing frame located in the next processing position descends and is transferred to the alignment stage by the transferring means.

4. An exposing apparatus according to claim 1, wherein the lower printing frame comprising:

a hose connecting part of the vacuum frame, the hose connecting part being provided at supply port opened on the under side of the lower printing frame communicating from a suction port of the vacuum frame to suck the work on the upper side of the lower printing frame, said hose connecting part providing a connecting part body and a ball valve floating in the connecting part body, said connecting part body being provided with one opening formed with smaller diameter than the diameter of the ball valve at the location where said connecting part body contacts to the supply port of the lower printing frame and another opening formed with smaller diameter than the diameter of the ball valve at the other side of the opening.

5. The exposing apparatus according to claim 4, wherein the lower printing frame is provided with two connecting parts located at least two positions which communicate with the suction holes to hold the work, said lower printing frame being provided with a retaining means to suck the work at under surface of the lower printing frame as well as provided with the connecting part at the location where the connecting part of the lower printing frame is reached on the alignment table located at one end of the lower printing frame, said lower printing frame being provided with connecting parts where the connecting parts of the lower printing frame are reached on the lift table located at another end of the lower printing frame, a delivery means to deliver the lower printing frame to both ends is provided with connecting parts where the connecting parts of the lower printing frame are reached, each of the connecting parts is communicated to an air pump to intake and exhaust the air, the connecting parts of the lower printing frame correspond to each of the connecting parts located in the lift table, transferring means and the alignment table for the operation of holding and displacing the work.

6. An exposing apparatus according to claim 1, wherein the alignment table comprises:

a suction and holding means to absorb the work and connecting parts to correspond to the connecting parts of the lower printing frame to hold the work, X, Y, θ tables to forward the lower printing frame with the work to X, Y and θ directions, respectively, the X and the Y tables being provided movably in the directions which are perpendicular to each other in the same plane, the θ table being provided rotatively around the vertical line, said alignment table including a lifting mechanism to lift up and down the work on the alignment table.

7. An exposing apparatus according to claim 1, wherein the upper printing frame comprises:

a frame of rectangular pattern, through holes for vacuum suction retained in the frame and a transparent plate with a seal rubber of rectangular pattern, said upper printing frame being provided with connecting pads for vacuum suction to communicate with the through holes of the transparent plate.

8. An exposing apparatus according to claim 1, wherein the reverse stage comprises:

a lifting table enabling the work thereon to lift up and down, a reverse device to receive the work from the lifting table to reverse the upper surface to the under surface of the work and a prealignment mechanism to prelocate the work already reversed and placed on the lifting table.

9. An exposing apparatus according to claim 8, wherein the reverse stage comprises:

a suction supporting arm to suck the work, a support section rotatable with the suction supporting arm and a delivery mechanism to deliver the rotatable support section returnably.

10. An exposing apparatus according to claim 1, wherein the ultraviolet rays irradiation stage comprises:

a light source including a ultraviolet irradiation lamp and an elliptical reflector, a plane reflector to change direction of the ultraviolet rays to a predetermined direction, a flyeye lens to change distribution of the light located in the way of ultraviolet rays coming from the light source, a change-over mirror to change the ultraviolet rays to the first and the second exposing stages, the direction of the irradiated rays from the light source is straight to the change-over mirror and from the change-over mirror the ultra-violet rays is changed to the direction with a predetermined inclination angle.

11. An exposing apparatus according to claim 1, wherein the handler comprises:

plane contacting parts, suction pads provided through the contacting parts, the under end of the suction pads being provided inside the level of the surface where the work is contacted.

12. An exposing method to expose a work by irradiation of ultraviolet rays by means of the exposing apparatus including an alignment table to transfer a work which is held on a lower printing frame to a predetermined position to locate the work, a first alignment stage providing a first camera to confirm a predetermined locating position, a first exposing stage to expose a located work, a reverse stage to reverse the exposed work from upper surface to under surface, an alignment table to transfer the work placed on the lower printing frame to a predetermined position, said work being already reversed from upper surface to under surface in the reverse stage a second alignment stage providing a second camera to confirm if said work has been properly located, and a second exposing stage to expose the already located work in the second alignment stage, and the exposing apparatus comprising the first alignment stage, the reverse stage and the second alignment stage, said first alignment stage, said reverse stage and said second alignment stage being arranged in a straight line direction, each of said first and second alignment stages being provided with the first exposing stage and the second exposing stage, respectively, in perpendicular direction to the straight line direction, and an ultraviolet rays irradiation stage provided between said first exposing stage and the second exposing stage, said exposing apparatus being provided with a plural number of handlers to transfer the work on the straight line direction from the first alignment stage to the second alignment stage, an upper printing frame and the lower printing frame of the exposing apparatus form a vacuum frame to perform locating, transfer and exposing of the work holding said work between the upper printing frame and the lower printing frame, said locating, transfer and exposing of the work being operated, between the alignment stage and the exposing stage by means of transferring means to transfer the work with the upper printing frame and the lower printing frame, the exposing method comprising the processes of:

a first preliminary locating process to preliminarily locate one surface of the work to be exposed, a second process to locate the work by means of the first alignment table and the first camera, said work being already preliminarily located in the first preliminary locating process and placed on the lower printing frame, a third process to transfer said preliminarily located work to the exposing stage, said preliminarily located work being held with the lower printing frame and the upper printing frame, a fourth process to transfer the exposed work with the lower printing frame by means of the transferring means to the first alignment table, a fifth process to transfer the work on the first alignment table to the reverse device by the handler, a sixth process to reverse the upper surface of the work to the under surface and preliminarily locate the work by a preliminary locating mechanism, a seventh process to locate the work by means of the second alignment table and the second camera, said preliminarily located work being held on the lower printing frame, an eighth process to transfer the work to the exposing stage, said already located work being held with the lower printing frame and the upper printing frame, a ninth process to transfer the work to the second alignment table by said transferring means, said work being held on the lower printing frame, and a tenth process to discharge the work from the alignment table, said work being already exposed the upper surface and the under surface thereof through aforementioned processes.

13. The method of locating the work according to claim 12, wherein the method further comprises:

a process to hold the lower printing frame of the vacuum frame on to the alignment table by means of the retaining means of the alignment table, a process to locate the work to the proper location by means of the alignment table by comparing with the location information of a mask film previously recognized by the camera, the work being held on the lower printing frame by means of the retaining means of the lower printing frame, a process to confirm positional deviation of the work with the mask film by means of the camera, said work being held on the lower printing frame separated from the alignment table, the other lower printing frame on the alignment table being lifted up by said alignment table to be assembled with the upper printing frame to form the vacuum frame after the second process, a process to transfer the work to the next process after accurate locating of said work being confirmed by the camera in the previous process and in case the locating of said work is not proper, the work being returned to the second process to start operation again.

14. An exposing method according to claim 12, wherein the reverse method comprises:

receiving an exposed work to retain and the one end of the work being utilized as abase to lift the other end of the work uprightly, the one end of the work utilized as a base being delivered horizontally and descends to reverse the upper surface to the under surface.

* * * * *